US012775051B2

(12) United States Patent
Jakupi

(10) Patent No.: US 12,775,051 B2
(45) Date of Patent: Oct. 27, 2026

(54) CIRCUIT BREAKERS WITH FIELD SERVICING CAPABILITY

(71) Applicant: Schneider Electric USA, Inc., Boston, MA (US)

(72) Inventor: Andi Jakupi, Marion, IA (US)

(73) Assignee: Schneider Electric USA, Inc., Boston, MA (US)

( * ) Notice: Subject to any disclaimer, the term of this patent is extended or adjusted under 35 U.S.C. 154(b) by 153 days.

(21) Appl. No.: 17/799,258

(22) PCT Filed: Feb. 19, 2021

(86) PCT No.: PCT/US2021/018800
§ 371 (c)(1),
(2) Date: Aug. 11, 2022

(87) PCT Pub. No.: WO2021/168265
PCT Pub. Date: Aug. 26, 2021

(65) Prior Publication Data

US 2023/0072238 A1 Mar. 9, 2023

Related U.S. Application Data

(60) Provisional application No. 62/979,864, filed on Feb. 21, 2020.

(51) Int. Cl.
*G01R 31/52* (2020.01)
*G01R 31/327* (2006.01)
*H02H 3/04* (2006.01)

(52) U.S. Cl.
CPC ......... *G01R 31/52* (2020.01); *G01R 31/3274* (2013.01); *G01R 31/3275* (2013.01); *H02H 3/04* (2013.01)

(58) Field of Classification Search
None
See application file for complete search history.

(56) References Cited

U.S. PATENT DOCUMENTS 5,982,596 A * 11/1999 Spencer ................. H02H 3/006 361/64
8,675,325 B2 3/2014 Beierschmitt et al.
(Continued)

FOREIGN PATENT DOCUMENTS

CN 103685071 A 3/2014
CN 105372515 A 3/2016
(Continued)

OTHER PUBLICATIONS

International Search Report and Written Opinion mailed Jun. 8, 2021 in International Application No. PCT/US2021/018800, 12 pages.

*Primary Examiner* — Nasima Monsur
(74) *Attorney, Agent, or Firm* — Wolf, Greenfield & Sacks, P.C.

(57) ABSTRACT

A method of monitoring a circuit having load(s) includes receiving normal-mode data from circuit breakers operating in a normal mode, transforming the normal-mode data into first display data, providing the normal-mode display data to a remote user device for display by a GUI of the user device, and receiving an external diagnostics request via the GUI of the user device for selected circuit breaker(s) to enter a diagnostics mode. In response to the external diagnostics request, an internal diagnostics request is sent to the selected circuit breaker(s). Diagnostics-mode data is received from the selected circuit breaker(s), wherein the diagnostics-mode data was obtained by the selected circuit breaker(s) operating in a diagnostics mode responsive to the internal diagnostics request. The method further includes determining second display data as a function of the diagnostic-mode (Continued)

data and providing the second display data to the user device for display by the user device's GUI.

23 Claims, 10 Drawing Sheets

(56) References Cited

U.S. PATENT DOCUMENTS

| | | | | |
|---|---|---|---|---|
| 9,966,206 | B1 | 5/2018 | Sastry et al. | |
| 2005/0273207 | A1 | 12/2005 | Dougherty | |
| 2006/0007619 | A1 | 1/2006 | Scott et al. | |
| 2008/0270075 | A1 | 10/2008 | Bertosa et al. | |
| 2009/0198459 | A1 | 8/2009 | Bilac et al. | |
| 2010/0033888 | A1 | 2/2010 | Dougherty | |
| 2012/0041696 | A1 * | 2/2012 | Sanderford, Jr. | G01D 4/004 702/62 |
| 2013/0226479 | A1 * | 8/2013 | Grosjean | G01R 31/52 702/58 |
| 2014/0059388 | A1 | 2/2014 | Patiev et al. | |
| 2014/0288753 | A1 | 9/2014 | Engdahl et al. | |
| 2014/0361913 | A1 | 12/2014 | Hsieh et al. | |
| 2015/0168487 | A1 | 6/2015 | Parker et al. | |
| 2016/0225562 | A1 * | 8/2016 | Franks | H02H 3/006 |
| 2018/0145497 | A1 | 5/2018 | Jakupi | |
| 2019/0386478 | A1 | 12/2019 | Raisigel et al. | |
| 2020/0059081 | A1 * | 2/2020 | Freeman | H04W 76/14 |
| 2023/0063811 | A1 | 3/2023 | Jakupi | |

FOREIGN PATENT DOCUMENTS

| | | | |
|---|---|---|---|
| CN | 108199942 | A | 6/2018 |
| JP | H0644887 | A | 2/1994 |
| JP | H06225439 | A | 8/1994 |
| JP | H-11120122 | A | 4/1999 |
| JP | 2002-218644 | A | 8/2002 |
| KR | 101457092 | B1 | 10/2014 |

* cited by examiner

CIRCUIT BREAKERS WITH FIELD SERVICING CAPABILITY

CROSS REFERENCE TO RELATED APPLICATIONS

This application is a 35 U.S.C. § 371 National Phase filing of International Application No. PCT/US2021/018800, filed on Feb. 19, 2021, which claims priority to and benefit of U.S. patent application Ser. No. 62/979,864 filed on Feb. 21, 2020, both of which are incorporated herein by reference in their entirety.

TECHNICAL FIELD

The present disclosure relates to circuit breakers and more particularly, to circuit breakers with field servicing capability.

BACKGROUND

Servicing an electrical system in the field is typically performed onsite by electricians. The field can be, for example, a home, an office, a factory, etc. An electrician typically relies on expensive tools that are external to the electrical system to perform the servicing. In addition to the expense involved in sending an electrician with the requisite skill and tools to the field, servicing in the field can be time consuming and require significant labor, e.g., to open load panels, open outlets, access cables, etc. Furthermore, servicing in the field can lack effectiveness, such as due to lack of repeatability or rare occurrence. As complexity of electrical system load centers increases, the need for servicing in the field is bound to increase and become even more cumbersome and complicated.

While conventional methods and systems have generally been considered satisfactory for their intended purpose, there is still a need in the art for servicing in the field without the need for skilled electricians or external tools, and with the capability of providing service remotely. The present disclosure provides a solution.

SUMMARY

The purpose and advantages of the below described illustrated embodiments will be set forth in and apparent from the description that follows. Additional advantages of the illustrated embodiments will be realized and attained by the devices, systems and methods particularly pointed out in the written description and claims hereof, as well as from the appended drawings. To achieve these and other advantages and in accordance with the purpose of the illustrated embodiments, in one aspect, disclosed is a method of monitoring by one or more circuit breakers a circuit having one or more loads. The method includes operating a first circuit breaker of the one or more circuit breakers in a normal mode, which includes outputting normal-mode data by the first circuit breaker, the normal-mode data including features of first signals acquired by the first circuit breaker about electrical properties of a circuit with a load, wherein the first signals are acquired or processed at a first resolution. The method further includes receiving a start-diagnostics request responsive to a user action, changing operation of the first circuit breaker to a diagnostics mode in response to receipt of the start diagnostics request, and operating the first circuit breaker in the diagnostics mode. Operating the first circuit breaker in the diagnostics mode includes outputting by the first circuit breaker diagnostics-mode data including second signals and/or features of the second signals acquired by the first circuit breaker about electrical properties of the circuit with the load, wherein the second signals are acquired or processed at a second resolution that is different than the first resolution.

In one or more embodiments, the method can further include receiving by the first circuit breaker an end-diagnostics request responsive to a user action or due to a determination to end the diagnostics mode based on satisfaction of a condition and terminating operation of the first circuit breaker in the second mode in response to receipt of the end diagnostics request.

In one or more embodiments, the normal-mode data can include results of analyzing the first signals for an electrical fault and the diagnostic-mode data includes results of analyzing the second signals for an electrical fault.

In one or more embodiments, operating the first circuit breaker in the second mode can further include at least one of acquiring the second signals and processing the second signals.

In one or more embodiments, the one or more circuit breakers can include at least two circuit breakers, and the method can further include the at least two circuit breakers receiving a broadcast silence request in association with the first circuit breaker receiving the diagnostics request, ceasing outputting the first data by the at least two circuit breakers in response receiving the silence request, the at least two circuit breakers receiving a broadcast end-silence request in association with the first circuit breaker receiving the end-diagnostics request, and resuming outputting the normal-mode data by the at least two circuit breakers in response to receiving the end-silence request.

In another aspect, disclosed is a method of monitoring a circuit having one or more loads. The method includes receiving normal-mode data from at least two circuit breakers operating in a normal mode, transforming the normal-mode data into first display data, providing the normal-mode display data to a remote user device for display by a graphical user interface (GUI) of the user device, and receiving an external diagnostics request via the GUI of the user device for one or more selected circuit breakers of the at least two circuit breakers to enter a diagnostics mode. In response to the external diagnostics request, an internal diagnostics request is sent to the one or more selected circuit breakers. Diagnostics-mode data is received from the one or more selected circuit breakers, wherein the diagnostics-mode data is obtained by the one or more selected circuit breakers operating in a diagnostics mode responsive to the internal diagnostics request. The method further includes determining second display data as a function of the diagnostic-mode data and providing the second display data to the user device for display by the GUI of the user device.

In one or more embodiments, the method can further include, in response to the external diagnostics request, sending a silence request to the at least two circuit breakers for operating in a silent mode, wherein the normal-mode data may not be received from the at least two circuit breakers while operating in the silent mode.

In one or more embodiments, the method can further include receiving an external end-diagnostics request via the GUI or determining to end the diagnostics mode based on satisfaction of a condition and, in response to the external end-diagnostics request or determination to end the diagnostics mode, sending an internal end-diagnostics request to the one or more selected circuit breakers. Receipt of the diagnostics-mode data from the one or more selected circuit breakers can be terminated due to the one or more selected circuit breakers terminating operation in the diagnostics mode responsive to the internal end-diagnostics request.

In one or more embodiments, the method can further include, in response to the external end-diagnostics request, sending an end-silence request to the one or more selected circuit breakers. Receipt of the normal-mode data from the at least two circuit breakers can be resumed due to the at least two circuit breakers transitioning to operation in the first mode responsive to the external end-diagnostics request.

In one or more embodiments, the method can further include disaggregating the diagnostics-mode data for associating the diagnostics-mode data with a circuit breaker of the at least two circuit breakers and/or a load of one or more loads coupled to the circuit breaker. Determining the second display data can include determining the second display data as a function of the diagnostics-mode data associated with the circuit breaker and/or the load.

In one or more embodiments, the external diagnostics request can include a request for trip history, and the method can further include receiving timestamped notification of any warning events detected by the at least two circuit breakers, wherein the warning events can be detected as a function of a return from a fault state to a normal state. The method can further include receiving timestamped notification of any trips of the at least two circuit breakers, storing the timestamped notifications of any warning events and any trips, and responding to the request for trip history by including trip history data with the second display data, wherein the trip history data can be a function of the timestamped notifications of any warning events and any trips.

In one aspect, also disclosed is a method of providing a GUI of a user device. The method includes receiving first display data from a remote processing device, wherein the first display data is based on normal-mode data obtained by at least two circuit breakers operating in a normal mode. The method further includes displaying the first display data by the GUI, receiving a user diagnostics request from a user via the GUI, submitting an external diagnostics request to the remote processing device responsive to receiving the user diagnostics request, wherein the external diagnostics request requests that one or more selected circuit breakers of the at least two circuit breakers enter a diagnostics mode. The method further includes receiving second display data from the remote processing device in response to the external diagnostics request, wherein the second display data is based on diagnostics-mode data obtained by the at least two circuit breakers operating in the diagnostics mode. The method further includes displaying the second display data by the GUI in association with the one or more selected circuit breakers.

In one or more embodiments, the normal-mode data is based on measurements by the at least two circuit breakers of a normal resolution and the diagnostics-mode data is based on measurements of a higher resolution by the at least two circuit breakers.

In one or more embodiments, the method can further include terminating receiving the first display data from the remote processing device in response to the submitted diagnostics request.

In one or more embodiments, the method can further include receiving an end-diagnostics request from a user via the GUI, and submitting an end-diagnostics request to the remote processing device, wherein the end-diagnostics request can request that the one or more selected circuit breakers exit the diagnostics mode. The method can further include at least one of terminating receiving the second display data from the remote processing device in response to the submitted end-diagnostics request and resuming receiving the first display data from the remote processing device in response to the submitted end-diagnostics request.

In one or more embodiments, the second display data can include an association between the diagnostics-mode data and a circuit breaker of the at least two circuit breakers and/or a load of one or more loads coupled to the circuit breaker. Displaying the second display data by the GUI can include displaying the association between the diagnostics-mode data and the circuit breaker and/or the load.

In one or more embodiments, the user request can request specific diagnostics information about monitoring for a selected electrical fault by the one or more selected circuit breakers and/or about trip history of the one or more selected circuit breakers. The external diagnostics request can request the specific diagnostics information, the displayed second display data can include the specific diagnostics information.

In another aspect of the disclosure, disclosed is a circuit breaker coupled to a circuit having one or more loads. Each of the circuit breakers includes a memory configured to store a plurality of programmable instructions and at least one processing device in communication with the memory. The at least one processing device of a first circuit breaker of the one or more circuit breakers, upon execution of the plurality of programmable instructions is configured to operate in a normal mode, which includes outputting normal-mode data, the normal-mode data including features of first signals acquired by the first circuit breaker about electrical properties of a circuit with a load, wherein the first signals are acquired or processed at a first resolution. The at least one processing device of the first circuit breaker, upon execution of the plurality of programmable instructions, is further configured to receive a start-diagnostics request responsive to a user action, change operation to a diagnostics mode in response to receipt of the start diagnostics request, and operate in the diagnostics mode. Operating in the diagnostics mode includes outputting diagnostics-mode data including second signals and/or features of the second signals acquired by the at least one processing device of the first circuit breaker about electrical properties of the circuit with the load, wherein the second signals are acquired or processed at a second resolution that is different than the first resolution.

In one or more embodiments, the at least one processing device of the first circuit breaker, upon execution of the plurality of programmable instructions, can be further configured to receive an end-diagnostics request responsive to a user action or due to a determination to end the diagnostics mode based on satisfaction of a condition and terminate operation in the second mode in response to receipt of the end diagnostics request.

In one or more embodiments, the normal-mode data can include results of analyzing the first signals for an electrical fault and the diagnostic-mode data includes results of analyzing the second signals for an electrical fault.

In one or more embodiments, operating in the second mode can further include at least one of acquiring the second signals and processing the second signals.

In one or more embodiments, the one or more circuit breakers can include at least two circuit breakers, and the method can further include the at least one processing device of each of the at least two circuit breakers being configured to receive a broadcast silence request in association with the at least one processing device of the first circuit breaker receiving the diagnostics request, cease outputting the first data in response receiving the silence request, receive a broadcast end-silence request in association with the at least one processing device of the first circuit breaker receiving the end-diagnostics request, and resume outputting the normal-mode data in response to receiving the end-silence request.

In still another aspect of the disclosure, disclosed is an edge device for monitoring electrical faults. The edge device includes a memory configured to store a plurality of programmable instructions and at least one processing device in communication with the memory, wherein the at least one processing device, upon execution of the plurality of programmable instructions is configured to receive normal-mode data from at least two circuit breakers operating in a normal mode, transform the normal-mode data into first display data, provide the normal-mode display data to a remote user device for display by a graphical user interface (GUI) of the user device, and receive an external diagnostics request via the GUI of the user device for one or more selected circuit breakers of the at least two circuit breakers to enter a diagnostics mode. The at least one processing device is further configured to, in response to the external diagnostics request, send an internal diagnostics request to the one or more selected circuit breakers and receive diagnostics-mode data from the one or more selected circuit breakers, wherein the diagnostics-mode data is obtained by the one or more selected circuit breakers operating in a diagnostics mode responsive to the internal diagnostics request. The at least one processing device, upon execution of the plurality of programmable instructions, is further configured to determine second display data as a function of the diagnostic-mode data and provide the second display data to the user device for display by the GUI of the user device.

In one or more embodiments, the at least one processing device, upon execution of the plurality of programmable instructions, can be further configured to, in response to the external diagnostics request, send a silence request to the at least two circuit breakers for operating in a silent mode, wherein the normal-mode data may not be received from the at least two circuit breakers while operating in the silent mode.

In one or more embodiments, the at least one processing device, upon execution of the plurality of programmable instructions, can be further configured to receive an external end-diagnostics request via the GUI or determine to end the diagnostics mode based on satisfaction of a condition and, in response to the external end-diagnostics request or determination to end the diagnostics mode, send an internal end-diagnostics request to the one or more selected circuit breakers. The at least one processing device, upon execution of the plurality of programmable instructions, can be further configured to terminate receipt of the diagnostics-mode data from the one or more selected circuit breakers due to the one or more selected circuit breakers terminating operation in the diagnostics mode responsive to the internal end-diagnostics request.

In one or more embodiments, the at least one processing device, upon execution of the plurality of programmable instructions, can be further configured to, in response to the external end-diagnostics request, send an end-silence request to the one or more selected circuit breakers. The at least one processing device, upon execution of the plurality of programmable instructions, can be further configured to resume receipt of the normal-mode data from the at least two circuit breakers due to the at least two circuit breakers transitioning to operation in the first mode responsive to the external end-diagnostics request.

In one or more embodiments, the at least one processing device, upon execution of the plurality of programmable instructions, can be further configured to disaggregate the diagnostics-mode data for associating the diagnostics-mode data with a circuit breaker of the at least two circuit breakers and/or a load of one or more loads coupled to the circuit breaker. Determining the second display data can include determining the second display data as a function of the diagnostics-mode data associated with the circuit breaker and/or the load.

In one or more embodiments, the external diagnostics request can include a request for trip history, and the at least one processing device, upon execution of the plurality of programmable instructions, can be further configured to receive timestamped notification of any warning events detected by the at least two circuit breakers, wherein the warning events can be detected as a function of a return from a fault state to a normal state. The at least one processing device, upon execution of the plurality of programmable instructions, can be further configured to receive timestamped notification of any trips of the at least two circuit breakers, store the timestamped notifications of any warning events and any trips, and respond to the request for trip history by including trip history data with the second display data, wherein the trip history data can be a function of the timestamped notifications of any warning events and any trips.

In one aspect, also disclosed is at least one processing device, upon execution of the plurality of programmable instructions, is further configured to receive first display data from a remote processing device, wherein the first display data is based on normal-mode data obtained by at least two circuit breakers operating in a normal mode. The at least one processing device, upon execution of the plurality of programmable instructions, is further configured to display the first display data by the GUI, receive a user diagnostics request from a user via the GUI, and submit an external diagnostics request to the remote processing device responsive to receiving the user diagnostics request, wherein the external diagnostics request requests that one or more selected circuit breakers of the at least two circuit breakers enter a diagnostics mode. The at least one processing device, upon execution of the plurality of programmable instructions is further configured to receive second display data from the remote processing device in response to the external diagnostics request, wherein the second display data is based on diagnostics-mode data obtained by the at least two circuit breakers operating in the diagnostics mode. The at least one processing device, upon execution of the plurality of programmable instructions is configured to display the second display data by the GUI in association with the one or more selected circuit breakers.

In one or more embodiments, the normal-mode data is based on measurements by the at least two circuit breakers of a normal resolution and the diagnostics-mode data is based on measurements by the at least two circuit breakers of a higher resolution.

In one or more embodiments, at least one processing device, upon execution of the plurality of programmable instructions, is further configured to terminate receiving the first display data from the remote processing device in response to the submitted diagnostics request.

In one or more embodiments, the at least one processing device, upon execution of the plurality of programmable instructions, is further configured to receive an end-diagnostics request from a user via the GUI, and submit an end-diagnostics request to the remote processing device, wherein the end-diagnostics request can request that the one or more selected circuit breakers exit the diagnostics mode. The at least one processing device, upon execution of the plurality of programmable instructions, is further configured to, in response to the submitted end-diagnostics request, at least one of terminate receiving the second display data from the remote processing device and resume receiving the first display data from the remote processing device.

In one or more embodiments, the second display data can include an association between the diagnostics-mode data and a circuit breaker of the at least two circuit breakers and/or a load of one or more loads coupled to the circuit breaker. Displaying the second display data by the GUI can include displaying the association between the diagnostics-mode data and the circuit breaker and/or the load.

In one or more embodiments, the user request can request specific diagnostics information about monitoring for a selected electrical fault by the one or more selected circuit breakers and/or about trip history of the one or more selected circuit breakers. The external diagnostics request can request the specific diagnostics information, the displayed second display data can include the specific diagnostics information.

In an additional aspect of the disclosure, disclosed is a non-transitory computer readable storage medium having one or more computer programs embedded therein, which when executed by a computer system, cause the computer system to receive first display data from a remote processing device, wherein the first display data is based on normal-mode data obtained by at least two circuit breakers operating in a normal mode. The computer system is further caused to display the first display data by the GUI, receive a user diagnostics request from a user via the GUI, and submit an external diagnostics request to the remote processing device responsive to receiving the user diagnostics request, wherein the external diagnostics request requests that one or more selected circuit breakers of the at least two circuit breakers enter a diagnostics mode. The computer system is further caused to receive second display data from the remote processing device in response to the external diagnostics request, wherein the second display data is based on diagnostics-mode data obtained by the at least two circuit breakers operating in the diagnostics mode. The at least one processing device, upon execution of the plurality of programmable instructions is configured to display the second display data by the GUI in association with the one or more selected circuit breakers.

In an additional aspect of the disclosure, disclosed is a non-transitory computer readable storage medium having one or more computer programs embedded therein, which when executed by a computer system, cause the computer system to receive normal-mode data from at least two circuit breakers operating in a normal mode, transform the normal-mode data into first display data, provide the normal-mode display data to a remote user device for display by a graphical user interface (GUI) of the user device, and receive an external diagnostics request via the GUI of the user device for one or more selected circuit breakers of the at least two circuit breakers to enter a diagnostics mode. The computer system is further caused, in response to the external diagnostics request, to send an internal diagnostics request to the one or more selected circuit breakers and receive diagnostics-mode data from the one or more selected circuit breakers, wherein the diagnostics-mode data is obtained by the one or more selected circuit breakers operating in a diagnostics mode responsive to the internal diagnostics request. The computer system is further caused to determine second display data as a function of the diagnostic-mode data and provide the second display data to the user device for display by the GUI of the user device.

In an additional aspect of the disclosure, disclosed is a non-transitory computer readable storage medium having one or more computer programs embedded therein, which when executed by a computer system, cause the computer system to receive first display data from a remote processing device, wherein the first display data is based on normal-mode data obtained by at least two circuit breakers operating in a normal mode. The computer system is further caused to display the first display data by the GUI, receive a user diagnostics request from a user via the GUI, and submit an external diagnostics request to the remote processing device responsive to receiving the user diagnostics request, wherein the external diagnostics request requests that one or more selected circuit breakers of the at least two circuit breakers enter a diagnostics mode. The computer system is further caused to receive second display data from the remote processing device in response to the external diagnostics request, wherein the second display data is based on diagnostics-mode data obtained by the at least two circuit breakers operating in the diagnostics mode. The computer system is further caused to display the second display data by the GUI in association with the one or more selected circuit breakers.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

A more detailed description of the disclosure, briefly summarized above, may be had by reference to various embodiments, some of which are illustrated in the appended drawings. While the appended drawings illustrate select embodiments of this disclosure, these drawings are not to be considered limiting of its scope, for the disclosure may admit to other equally effective embodiments.

Identical reference numerals have been used, where possible, to designate identical elements that are common to the figures. However, elements disclosed in one embodiment may be beneficially utilized on other embodiments without specific recitation.

DETAILED DESCRIPTION

Figure 1:
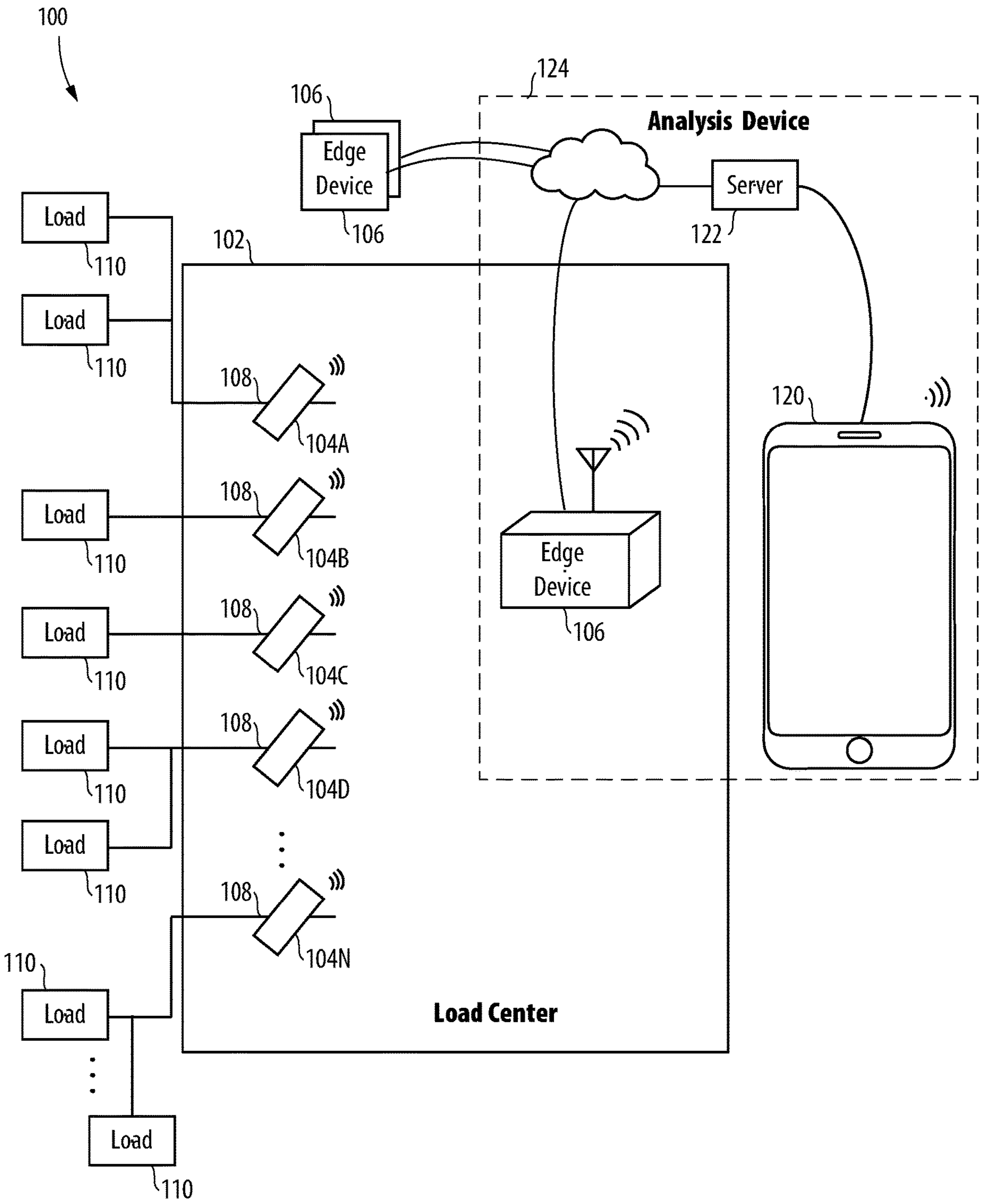
FIG. 1 is a block diagram illustrating an example circuit management system, in accordance with embodiments of the disclosure.

Reference will now be made to the drawings wherein like reference numerals identify similar structural features or aspects of the subject disclosure. For purposes of explanation and illustration, and not limitation, a schematic diagram of an exemplary embodiment of circuit management system in accordance with the disclosure is shown in FIG. 1 and is designated generally by reference character 100. Other embodiments of a circuit management system in accordance with the disclosure, or aspects thereof, are provided in FIGS. 2-6, as will be described.

Circuit management system 100 includes a load center 102, a user device 120, and a cloud-based server 122. Load center 102 includes one or more circuit breakers 104A-N (referred to generally (individually or as a group) as circuit breakers 104) and an edge device 106. Load center 102 is not limited to a specific number of circuit breakers 104 or edge devices 106, and the numbers of circuit breakers 104 and edge devices 106 shown are for illustration purposes only. Circuit breakers 104 and edge device 106 are configured to communicate with one another in at least a normal mode and a diagnostics mode. The communication between circuit breakers 104 and edge device 106 can be wired or wireless. The normal mode and diagnostics modes can use different communication rates.

Each circuit breaker 104 is coupled to an electrical circuit, referred to as branch 108, which includes interfaces to one or more loads 110, e.g., appliances, motors, etc. Each circuit breaker 104 senses electrical characteristics of its corresponding branch 108 and can be configured to detect conditions associated with branch 108 that can lead up to a trip in which a switch of the circuit breaker 104 is controlled to interrupt current flow. The trip can be a wanted trip in which an electrical problem has been detected, or an unwanted trip (also referred to as a nuisance trip) and provide warnings to edge device 106.

Edge device 106 can be physically remote from or physically connected to load center 102. Edge device 106 further communicates via wired and/or wireless communication with user device 120 and a remote server 122. Communication between circuit breakers 104 and edge device 106 and communication between edge device 106 and user-device can use wireless communication, such as near-field communication or WiFi communication (e.g., using protocols such as ZigBee™, Bluetooth™ low Energy (BLE), Bluetooth™ (BL) 4.0, WiFi, etc., without limitation). It is also understood that communication between edge device 106 and user device 106 and/or server 122 can included wired and optionally wireless communication via a network, such as via a local area network (LAN) or a public or private wide area network (WAN), such as the Internet (e.g., using a protocol such as Ethernet TCP/IP, without limitation). Information communicated between circuit breakers 104 and edge device can be packetized. Similarly, information communicated between edge device and user device 120 and/or server 122 can be packetized.

When operating in normal mode, circuit breakers 104 can acquire low-resolution current and voltage measurements and output the metering data 106 as low-resolution data to edge device 106. The metering data includes, for example, basic data based on the low-resolution current and voltage measurements (e.g., sampled at a low rate), such as integration of power over 1 second. Metering data is transmitted to edge device 106 at a relatively low rate, such as 0.5 Hz or 1 Hz. The rate at which metering data is transmitted can be configured to enable all of the circuit breakers 104 to transmit metered data to edge device 106 when operating in normal mode. Edge device 106 can communicate the metering data received from the respective circuit breakers 104 to user device 120 and/or a server 122.

When operating in diagnostics mode or normal mode, a circuit breaker 104 can detect warning events associated with a particular pattern of transitions between states of fault-detection and output warning event notifications to edge device 106.

When operating in diagnostics mode, a circuit breaker 104 can collect results of internal diagnostics information about circuit breaker 104, acquire high-resolution measurements, such as raw data, waveforms for voltage, line current, RF presence samples, voltage and line current samples (e.g., sampled at a higher rate than the metering data), and RF receiver strength signal indicator (RSSI). Circuit breaker 104 can further perform processing of the high resolution measurements (e.g., to determine root-mean-square (RMS) values and aggregate the high resolution measurements). Circuit breaker 104 outputs to edge device 106 the information collected and processed while operating in diagnostics mode as diagnostics-mode information. The circuit breaker 104's diagnostics mode information includes, for example, the internal diagnostics information, the high-resolution measurements, and results of processing the high-resolution measurements.

When operating in diagnostics mode, edge device 106 can process and communicate the diagnostics-mode information received from circuit breaker 104 and output the information as diagnostics data to user device 120 and/or server 122. Edge device 106 can include a history of the diagnostics-mode information with the diagnostics data output to user device 120 or server 122. Furthermore, edge device 106 can process and communicate to the user device 120 or server 122 historical information about trip history (trips, warning event notifications, and impending trip determinations based on processing the warning event indications). Data output by circuit breaker 104 and the edge device 106 (when operating in normal or diagnostics mode) can be provided with contextual information, such as identification (ID) of the device outputting the data, a time stamp, the branch 108 or load 110 to which the circuit breaker 104 is connected, or the circuit breaker 104 with which the edge device 106 is coupled. The contextual information can be provided as metadata.

The external and internal diagnostics requests can request specific information of the circuit breaker's diagnostics-mode information. The diagnostics-mode information output by the circuit breaker(s) 104 can depend on what was requested by the internal diagnostics request that prompted operation in diagnostics mode. Similarly, the diagnostics data output by edge device 106 to user device 120 and/or server 122 can depend on what was requested by the external diagnostics request that prompted operation in diagnostics mode.

Circuit breakers 104, edge device 106, user device 120, and server 122 include a processing device operatively connected to, and/or integrated with, a memory and a communication interface for communicating with other components of circuit monitoring system 100, as described. The processing device can include, for example a microcontroller, microprocessor, programmable logic device (PLD), digital signal processor (DSP), a microcontroller, field programmable gate arrays (FPGA), an application specific integrated circuit (ASIC), and/or other discrete or integrated logic circuitry having similar processing capabilities. In one or more embodiments, circuit breakers 104 and/or edge device 106 can be configured, respectively, as an embedded device.

Edge device 104 communicates with circuit breakers 104A-N (without limit to a specific number of circuit breakers 104), forming a network having a topology, such as a star topology. In one or more embodiments, there is a limited bandwidth for supporting communication between circuit breakers 104A-N and edge device 106. When all of circuit breakers 104 operate in normal mode, the bandwidth can support each of the circuit breakers 104A-N sending its respective metering data. However, when operating in diagnostics mode and outputting diagnostics-mode information in response to an internal diagnostics request, a circuit breaker 104 outputs a much larger volume of data than when operating in normal mode and outputting metering data. The bandwidth can only support communication of a particular number of circuit breakers 104A-N when operating in diagnostics mode.

In the example that follows, the bandwidth can only support one circuit breaker 104 that is outputting information in response to an internal diagnostics request and cannot support communication of the other circuit breakers 104 in normal or diagnostics modes. However a person skilled in the art will understand that the disclosed method can be adjusted to allow more than circuit breaker 104 to communicate at a time when operating in the diagnostics mode, if supported by the bandwidth. A person skilled in the art will also understand that the disclosed method can be adjusted to allow one or more of the other circuit breakers 104 to operate in normal mode and output metering data even while one or more of the circuit breakers 104 is operating in diagnostics mode. In fact, as wireless capacity increases in the future, the limitations of the bandwidth may change and the algorithm can be adjusted to maximize the amount of communication that can be supported by the bandwidth.

An external device, such as user device 120 or server 122 can submit an external diagnostics request to edge device 106 that one of the circuit breakers 104 change from normal mode to diagnostics mode. As mentioned above, in this example, only one circuit breaker 104 is requested to change mode, such as due to bandwidth limitations for communication between circuit breakers 104 and edge device 106, however the disclosure is not limited to this example. Accordingly, it is envisioned that more than one circuit breaker 104 can be requested to change to a diagnostics mode, followed by the requested circuit breakers 104 changing modes.

The external diagnostics request can be submitted to edge device 106 via a graphical user interface (GUI) provided by either of user device 120 and server 122. The external diagnostics request identifies the circuit breaker, in this example circuit breaker 104A, that is being requested to operate in diagnostics mode. In one or more embodiments, multiple diagnostics sub-modes are available, each requesting a different set of diagnostics data (e.g., about monitoring an arc fault, a ground fault or trip history). The external diagnostics request can further specify specific information of the circuit breaker 104's diagnostics-mode information, such as by a user selecting specific data or a diagnostics sub-mode via the GUI of the user device 120 or server 122.

Upon receipt by edge device 106 of an external diagnostics request identifying circuit breaker 104A to enter diagnostics mode and provide specific detailed information, edge device 106 sends an internal diagnostics request to the identified circuit breaker 104A and a silence request to the remaining circuit breakers 104B-104N. The external diagnostics request and/or the silence request can be broadcast requests or unicast requests. The external diagnostics request is sent either directly to circuit breaker 104A as a unicast request or identifies circuit breaker 104A in the broadcast request. In either case, circuit breaker 104A recognizes that it has been requested to transition from normal mode to diagnostics mode, and ignores the silence request. The remaining circuit breakers 104B-104N receive unicast or broadcast requests to transition to silent mode and reduce or cease their respective output to edge device 106 in order to provide sufficient bandwidth for circuit breaker 104A to send the requested diagnostics-mode information for the duration of a diagnostics session. The diagnostics session can end after a fixed time period or in response to an event, such as receipt of an external end-diagnostics request by edge device 106 from user device 120 or server 122, or receipt of an internal end-diagnostics request by circuit breakers 104 from edge device 106. At the end of the diagnostics session, all of the circuit breakers 104 can resume operating in normal mode and sending metering data.

Figure 2:
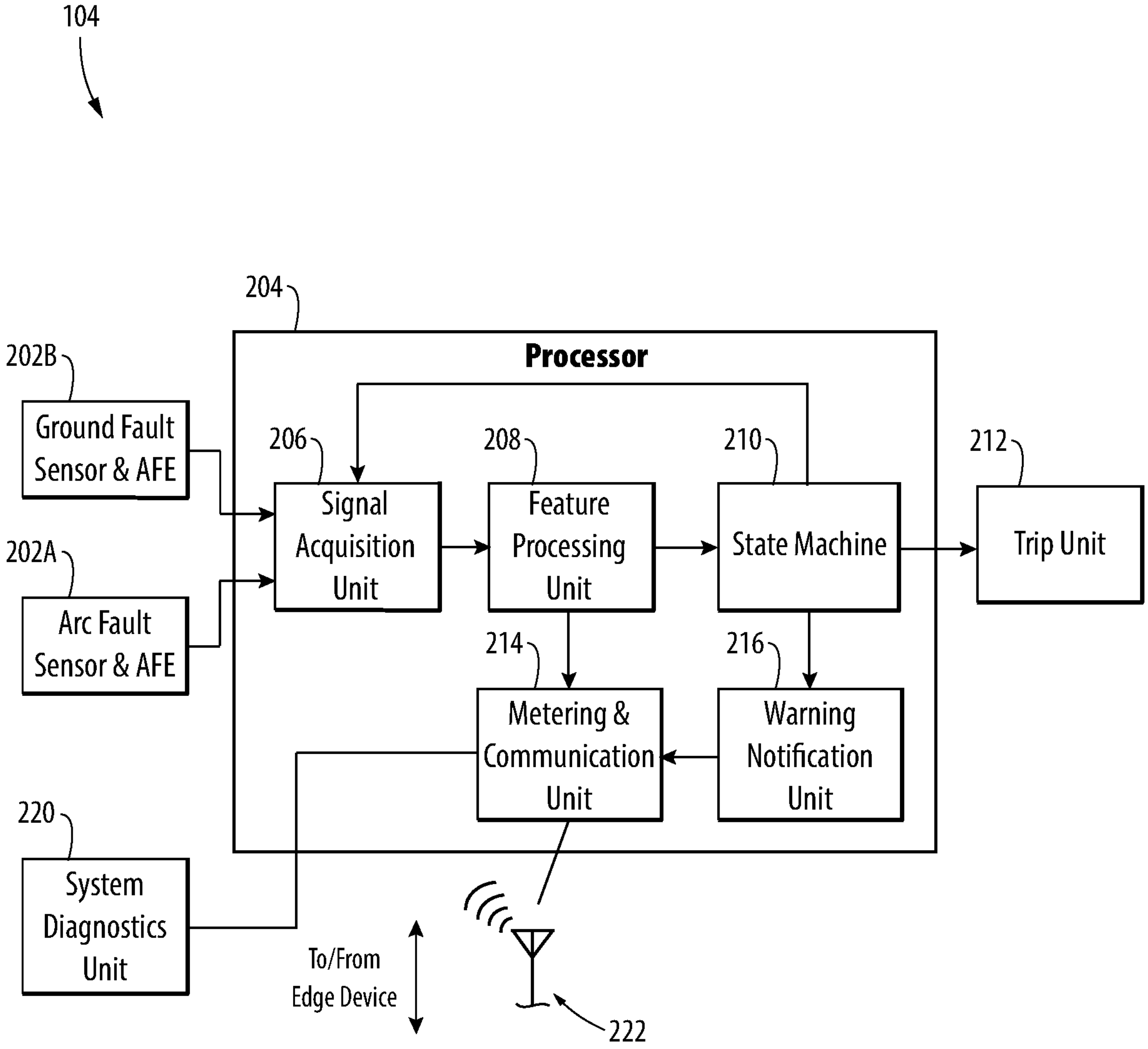
FIG. 2 is an example flow diagram of a circuit breaker of the circuit management system of FIG. 1, in accordance with embodiments of the disclosure.

With reference to FIG. 2, and continued reference to FIG. 1, a block diagram of an example configuration of circuit breaker 104 is shown. Circuit breaker 104 includes arc fault sensor(s) and analog front-end (AFE) 202A ground fault sensor(s) and AFE 202B, processor 204, trip unit 212, and a system diagnostics unit 220. Processor 204 is shown to include signal acquisition unit 206, feature processing unit 208, and state machine 210. In one or more embodiments, processor 204 further includes metering and communication unit 214 and warning notifications unit 216.

Processor 204 can include one or more processing devices and can be implemented in hardware, software, and/or firmware, such as any of a microprocessor, ASIC, PLD, FPGA. In one or more embodiments, any of signal acquisition unit 206, feature processing unit 208, state machine 210, metering and communication unit 214, and warning notifications unit 216 can be external to and accessible to processor 204. One or more of the other components of circuit breaker 104, or a portion of the components, can be integrated with processor 204.

Sensors of arc fault sensor(s) and AFE 202A and ground fault sensor(s) and AFE 202B sense physical characteristics and output sensor signals. Examples of physical characteristics include real-time signals and related electrical characteristics of the branch 108 to which circuit breaker 104 is coupled. The sensors can sense, for example, line current, line voltage, RF signals, RSSI for sensed HF signals, and differential current, without limitation to these particular electrical characteristics. The sensors can be configured to monitor for one or more of arc-faults, ground faults, grounded neutrals, power consumption, etc.

AFE circuits of arc fault sensor(s) and AFE 202A and ground fault sensor(s) and AFE 202B include analog signal conditioning circuitry for conditioning sensed signals to interface with other components of circuit breaker 104, such as filters, signal amplifiers, analog-to-digital (A/D) converter, microcontroller, etc.

Signal acquisition unit 206 includes an A/D converter configured to continuously convert analog sensor signals from arc fault sensor(s) and AFE 202A and ground fault sensor(s) and AFE 202B to digital sensor signals, such as for each half-cycle of signals along the corresponding branch 108, e.g., signals having a 50 Hz or 60 Hz frequency.

Feature processing unit 208 is configured to receive the digital sensor signals and compute and output feature data representing features of the digital sensor signals extracted from received signals using signal processing techniques. Feature data include, for example values for peak current (Ipeak), root mean square (RMS) current (Irms), peak voltage (Vpeak), RSSI transitions, RSSI Signal-to-Noise Ratio (SNR), current phase (Iphase), RSSI energy, etc. The feature data can include feature data about high frequency (HF) and/or low frequency (LF) signals from signal acquisition unit 206. In one or more embodiments, the HF and LF feature can be stored in a queue of feature processing unit 208.

System diagnostics unit 220 is configured to perform diagnostics, e.g., self-tests, on internal circuits of circuit breaker 204. For example, system diagnostics unit 220 can perform diagnostics on arc fault sensor(s) and AFE 202A and ground fault sensor(s) and AFE 202B, a microcontroller (MCU) of processor 204, internal communication channels, position of a switch of the circuit breaker, integrity of the firmware and memory, etc. Information output by system diagnostics unit 220 is referred to as self-test information.

State machine 210 (SM) applies a fault detection algorithm that detects faults (arc (in series or in parallel with load), ground, and grounded neutral faults) in the associated branch 108 that can be used to trigger a trip (e.g., control the switch that interrupts current flow). Hazardous arc faults and ground faults can be detected based on the profile of certain arc-fault half-cycles or ground fault half-cycles, as described in standards, such as Underwriters Laboratories (UL) and International Electrotechnical Commission (IEC). However, there are non-hazardous arcing or ground fault half-cycles that are not hazardous. For example, some arcing half-cycles are caused by fast transients of load switching or normal operation of the load or occur for a very short amount of time and do not result into potential ignition of fire.

State machine 210 includes two or more states, including at least a normal state and a fault state. When operating in the normal state, a load 110 connected to circuit breaker 104 and circuit breaker 104 are operating without detection of a fault. The state transitions to the fault state after detection of a fault. When a fault is sufficiently severe enough to trigger a trip of circuit breaker 104, state machine outputs a command to trip unit 212 to trip circuit breaker 104 by opening a contact to stop flow of current.

In one or more embodiments, state machine 210 detects a transition from a normal state, to a fault state, and back to the normal state, which indicates that a fault condition was detected, but the detected fault was not severe enough to trigger a trip of circuit breaker 104. In this case, since the detected fault could be an indicator of an impending trip and the need to service or replace a load or cable connected to circuit breaker 104, or circuit breaker 104 itself, a warning event notification is triggered. The warning event notification is provided internally to warning notification unit 216.

Detection and notification of a warning event due to transitions of state machine 210 from normal state, to fault state, and back to normal state are described by concurrently filed patent application entitled "CIRCUIT BREAKERS WITH NOTIFICATION AND REPORTING CAPABILITY" to the same inventor and assigned to the same assignee as the present disclosure, which is incorporated by reference herein in its entirety.

In one or more embodiments, warning notifications unit 216 receives an internal warning event notification from state machine 210 and provides the internal warning notification to metering and communication unit 214.

Metering and communication unit 214 outputs metering data. Metering data can include basic data, such as integration of power over 1 second, RMS voltage, RMS current, etc. Metering data is sent for at a relatively low rate, such as 0.5 Hz or 1 Hz. The rate at which metering data is transmitted can be configured to enable all of the circuit breakers 104 to transmit metered data to edge device 106 when operating in normal mode.

In one or more embodiments, metering and communication unit 214 receives the internal warning event notification from warning notifications unit 216, which triggers metering and communication unit 214 to obtain HF and LF feature data from feature processing unit 208 and to output an external warning event notification with the HF and LF feature data (also referred to as warning data) to edge device 106. The information sent to edge device 106 can be packetized prior to output.

Warning event notifications and warning data can be output by a circuit breaker 104 when operating in normal mode or diagnostics mode. Edge device 106 may only display a history of the warning events notifications when operating in diagnostics mode.

In one or more embodiments, any of analysis devices 124, including edge device 106, user device 120, and server 122 can receive and process the data output by circuit breakers 104 and/or exchange results of the processing.

Any of analysis devices 124 (also referred to individually or collectively as analysis device 124) can process and/or store (using associated storage devices) the data output from circuit breakers 104. Storage can be provided by storage devices accessible to the analysis device 124.

Analysis device 124 can process the circuit breakers' output data by disaggregating the warning data using any known techniques or techniques not yet discovered, e.g., according to a load identified as being associated with a particular circuit breaker 104, and pairing the disaggregated warning data with the load identified.

Analysis device 124 can further build a statistical model based on the warning data as well as other parameters, such as frequency of occurrence of the warning events, duration of the warning events (usually in half-cycles, e.g., measured as the duration of fault state without causing a trip (e.g., start of transition from normal state to fault state and the transition back to normal state)). In this way, circuit breakers 104 having sensitive arc fault and/or ground fault detection hardware can apply the electrical fault detection algorithm to provide multiple instances of queued data to edge device 106. Analysis device 124 can use the warning data to create historical data and apply the warning data to statistical models for deducing or predicting, for example, load wear or ageing conditions and/or future trips.

Such predictions can utilize a probabilistic learning approach. The probabilistic can include multiple dimensions of a collected information space. The information space is based on any combinations of the HF and LF features, but is not limited to duration of the warning, frequency of the warning, etc.

In one or more embodiments, analysis device 124 can generate a model for a load. Analysis device 124 can determine a time line of operation of the load. The time line can be implemented to determine time of use and frequency of warning events, for example based on operation of the load over time without triggering any warning events. Once a circuit breaker 104 triggers one or more warning events, analysis device 124 can determine, and update over time, a probability of a warning event, based on operation of the load and the occurrence of further warning events.

Analysis device 124 can output an impending trip notification to a user (e.g., via user device 120) and/or a third party (e.g., manufacturer of the load, service company for servicing the load, appliance rating organization, etc.) that a future trip might occur and make predictions based on trends, such as an increase in duration and/or frequency of warning events.

In one or more embodiments, analysis device 124 can generate or apply one or more models based on values of warning data received from a circuit breaker 104 in association with one or more warning events that correspond to a particular load. Analysis device 124 can thus learn about operation of the various loads coupled to a load center 102 based on associated warning events and create a statistical and/or numerical model, for example, for each load.

When edge device 106 is not an analysis device 124 that determines impending trips, edge device 106 can respond to the external diagnostics request with diagnostics-mode information output by the circuit breaker when operating in diagnostics mode. The user device 120 or server 122 can operate as an analysis device 124 to determine an impending trip and output an impending trip notification. When edge device 106 is an analysis device 124 that determines impending trips, edge device 106 can respond to an external diagnostics request with trip history information that includes impending trip notifications and associated time stamps.

Thus, the user device 120 or server 122 can receive notification of or determine that there is a likelihood of an impending trip. This can provide an early warning to a user or a third party that a potential trip is likely to occur in association with a particular load or clarify that a nuisance trip is an indicator of an impending real (wanted) trip. The notification of impending trip can provide information to the user and/or a third-party for taking action (e.g., repair or replacement of the load). Early action can avert failure of a load 110 at an inconvenient time, such failure of a washing machine while full with water or failure of an oven on the day of a holiday dinner.

Submission and response to an external diagnostics request is illustrated in screen shots shown in FIG. 3. At user device 120 or server 122, a user (which can be a user of user device 120 or server 122) navigates to a settings page for settings associated with edge device 106. The user can operate a GUI provided by a field servicing application executed by user device 120 or server 122. Edge device 106 responds to the user input by interacting with circuit breakers 104 of load center 102 and sending diagnostics data to the user device 120 or server 122 that submitted the external diagnostics request. As an example, and without limitation to a particular user interface for communicating with edge device 106, the user can navigate to a maintenance page from the settings page. The maintenance page provides an interactive graphical entities (IGEs) that represent circuit breakers 104 available at the load center 102. The user can select a particular circuit breaker 104 by activating an IGE associated with the selected circuit breaker 104, which submits an external diagnostics request to edge device 107. Information can be added to the external diagnostics request by additional user selections via the GUI (or other user interface) provided. In this example, only one circuit breaker 104 is selected, however the disclosure allows for the possibility of selecting multiple circuit breakers 104.

Edge device 106 responds to the external diagnostics request by submitting an internal diagnostics request to the selected circuit breaker 104 and receiving diagnostics-mode information in response to the internal diagnostics request. Edge device 106 outputs report results (which are based on the diagnostics-mode information received from the selected circuit breaker 104) for display by the GUI. The GUI transitions to a main diagnostics page for displaying the report results. In the current example, the report results are the most recent results, and the diagnostics page is updated periodically in real time. In one or more embodiments, the diagnostics page can also show previous report results and/or trends in the report results.

Figure 3A:
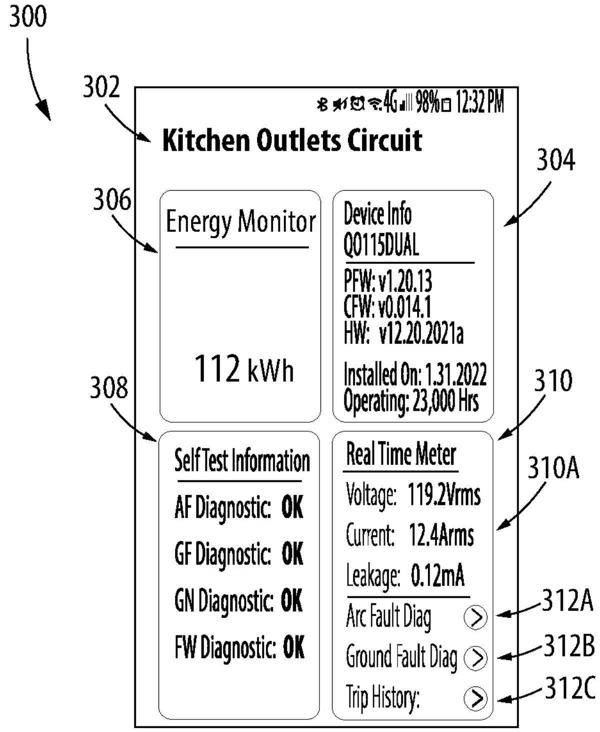
FIGS. 3A-3D include example screenshots of pages rendered by a field servicing application executed by a user device or server of the circuit monitoring system shown in FIG. 1, in accordance with embodiments of the disclosure.
Figure 3B:
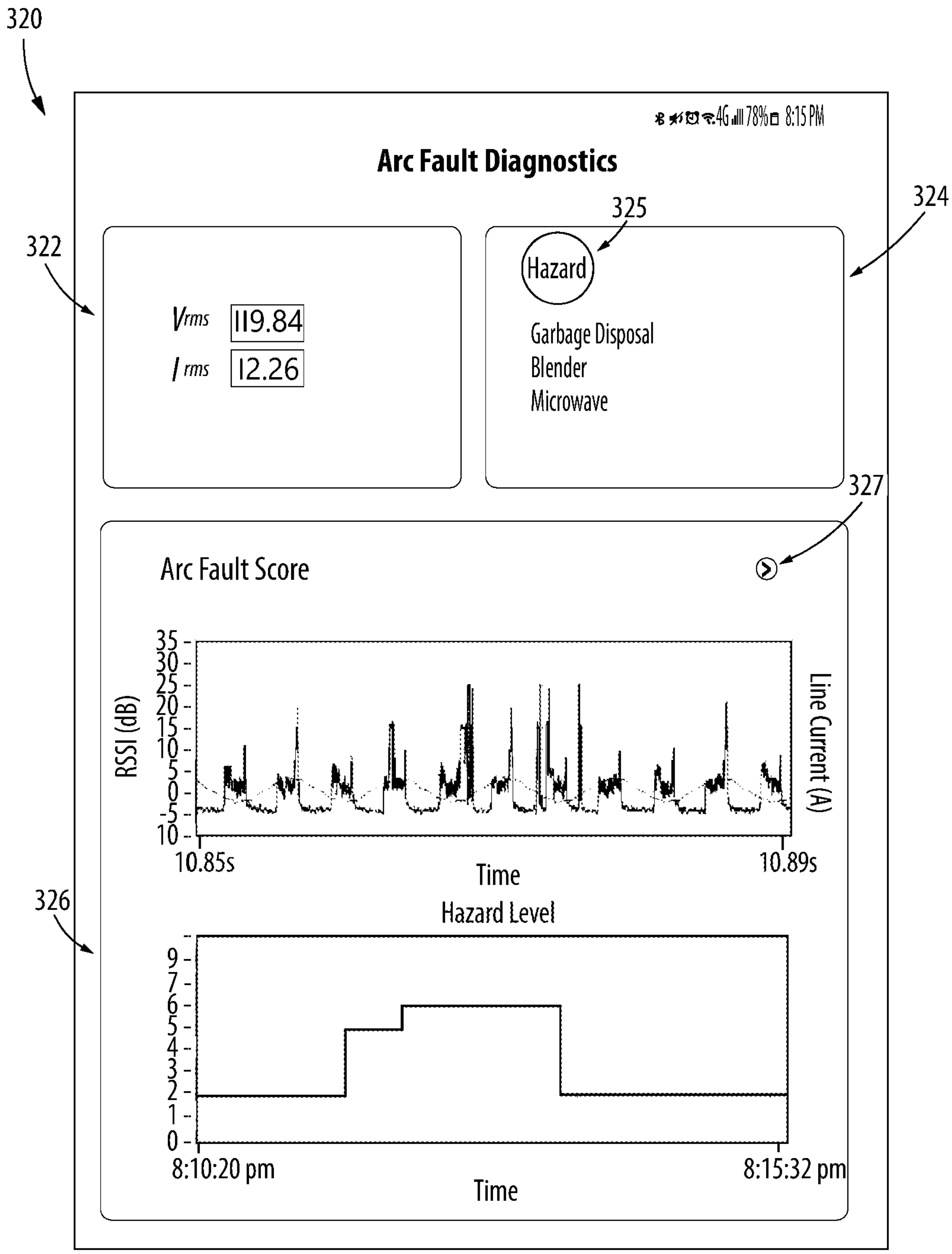
Figure 3C:
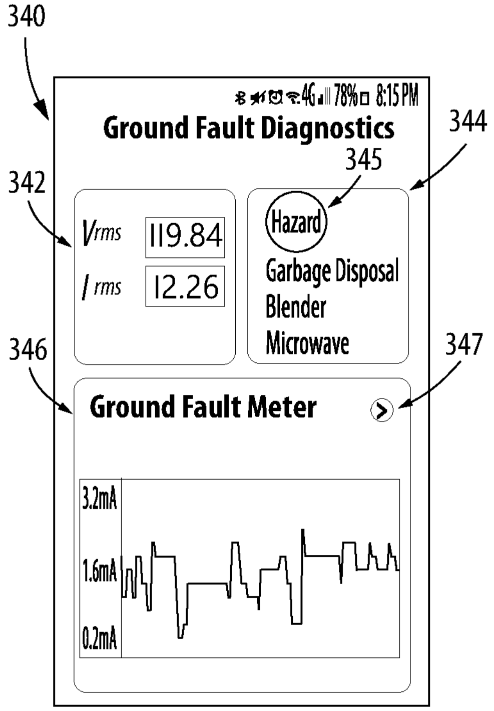
Figure 3D:
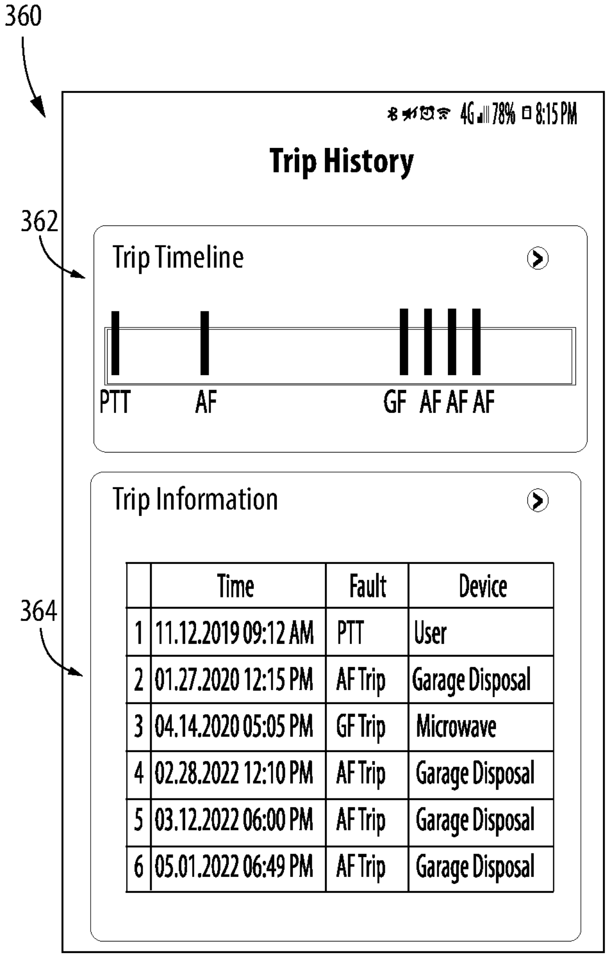

FIG. 3A shows an example main diagnostics page screenshot 300 that is displayed by the GUI and shows the report results for the selected circuit breaker 104. The main diagnostics page functions as a maintenance page that triggers entering the diagnostics mode when opened. The report results includes a label 302 that identifies the circuit to which the selected circuit breaker 104 is connected The report results are further incorporated into details tile 304 (such as the circuit breaker's software and hardware versions, etc.), energy monitor tile 306 (including, for example an indication of daily usage over the past week/month and/or recent real-time measurements output by the selected circuit breaker 104 (shown in the example as energy kwh used), self-test information tile 308 (such as pass/fail results of one or more self-tests), real time meter tile 310 having fault/trip options 312 that have associated IGEs that the user can activate to access pages with additional information. Fault/trip options 312 include an arc fault diagnostics option 312A, a ground fault diagnostics option 312B, and a trip history option 312C. Activation of the IGE associated with any of the fault/trip options 312 results in the field servicing application rendering an appropriate fault page, namely an arc fault diagnostics page 320, a ground fault diagnostics page 340, or a trip history page 360.

Upon selection of arc fault diagnostics option 312A, the arc fault diagnostics page 320 is updated with information provided by the diagnostics-mode information from the selected circuit breaker 104 and displayed. Arc fault diagnostics page 320 includes a meter tile 322 that shows real time line voltage and line current measurements, a device list tile 324 that shows a list of loads (e.g., appliances) connected to the selected circuit breaker 104 and currently operating. Device list tile 324 includes a hazard fault indicator 325 that indicates when a hazardous fault has been detected. In the example shown, hazard fault indicator 325 can indicate "Safe" when no hazardous fault is detected, or "Hazard" when a hazardous fault is detected.

The device list is determined by edge device 106 using load disaggregation techniques. The loads 110 identified in device list (in one or more embodiments, if incuded in the device list for a threshold amount of time) can be stored (locally at edge device 106 or remotely by user device 120 or server 122), such as in association with contextual information, such as timestamps that indicate time of operation, identification of the branch 108 and circuit breaker 104 to which they are connected, etc.

Arc fault diagnostics page 320 also includes an arc fault scope tile 326 that displays values for raw data or aggregated HF and LF feature data related to arc fault monitoring using output from arc fault sensor(s) and AFE 202A (referred to collectively as arc fault data, such as state transitions, RF presence, power consumption, alarms, etc.). The arc fault data displayed by arc fault scope tile 326 can be provided, for the example, by signal acquisition unit 206 or feature processing unit 208 shown in FIG. 2. In the example shown, the arc fault data is displayed graphically. The arc fault data can be disaggregated per one or more selected load of the loads displayed in device list tile 324 before display. The user can select from a menu of available arc fault data to be displayed using an arc fault data selector IGE 327. The information displayed by arc fault diagnostics page 320 is refreshed, e.g., periodically, such as at 1 second intervals.

Arc hazard indicator 325 is enabled to indicate in real time the presence of a hazard condition during each occurrence of indication of an arcing half-cycle by the HF and LF data from the selected circuit breaker 104. In this way, when monitoring or troubleshooting the branch 108 or load to which the selected circuit breaker 104 is connected, an indication of arcing activity by arc hazard indicator 325 can alert a diagnostics user (e.g., electrician, home owner, remote operator of user device 120 or server 122) to examine the branch 108 or load 110 while the suspect load(s) 110 is operating to identify a source or the hazard condition. The examination can be performed visually and/or by using the field servicing application.

Upon selection of ground fault diagnostics option 312B, the ground fault diagnostics page 340 is updated with the diagnostics-mode information provided by the selected circuit breaker 104 and displayed. Ground fault diagnostics page 340 includes a meter tile 342 that shows real time voltage and line current measurements and a device list tile 344 that shows a list of loads connected to the selected circuit breaker 104 and currently operating. The loads 110 identified in device can be determined using disaggregation techniques and can be stored with associated contextual information. Device list tile 344 includes a hazard fault indicator 345 that indicates when a hazardous fault has been detected. In the example shown, hazard fault indicator 345 can indicate "Safe" when no hazardous fault is detected, or "Hazard" when a hazardous fault is detected.

Ground fault diagnostics page 340 also includes a ground fault scope tile 346 that displays values for raw data or aggregated HF and LF feature data related to ground fault monitoring using output from ground fault sensor(s) and AFE 202B (referred to collectively as ground fault data). Ground fault data includes samples from ground fault sensor (s) and AFE 202B, data pertaining to leakage current between the line and ground (e.g., measured in mArms, of frequency bins in Hz), and ground neutral data showing, for example, differential current transformer resonance frequency, etc. The ground fault data displayed by ground fault scope tile 346 can be provided, for example, by signal acquisition unit 206 or feature processing unit 208 shown in FIG. 2. In the example shown, the ground fault data is displayed graphically. The disaggregated load information displayed in device list tile 344 is retrieved from metadata stored in edge device or server. The user can select from a menu of available ground fault selected features to be displayed using a ground fault data selector IGE 347. The information displayed by ground fault diagnostics page 340 is refreshed, e.g., periodically, such as at 1 second intervals.

Ground hazard indicator 345 is enabled to indicate in real time the presence of a hazard condition during each occurrence of indication of a high current leakage half-cycle by the ground fault data from the selected circuit breaker 104. Ground hazard indicator 345 provides an alert than can prompt a diagnostics user to investigate further whether the leakage level reaches or is near the maximum allowed by the IEC/UL standard and whether it is safe or not to continue operating with this circuit.

Upon selection of trip history option 312C, a history of trip event, trip, and/or impending trip notifications is retrieved from edge device 106, and the trip history page 360 is updated and displayed. Trip history page 360 includes a trip timeline tile 362 that shows a timeline of trip event, trip, and/or impending trip notifications output by edge device 106 and a trip information tile 364 that shows information associated with each trip event, trip, and/or impending trip notifications, such as time, type of fault, and load operating when the notification was output by edge device 106. The types of fault can include, for example, AF (arc fault), GF (ground fault), PTT (push to test, which indicates a user activated a test button on the circuit breaker 104 that causes test signals to be injected in the circuit breaker 104 for self-testing hardware), etc.

In one or more embodiments, the information displayed by trip history page 360 is refreshed in response to an event, such as an occurrence of a trip, receipt of a warning event notification by edge device 106 from the selected circuit breaker 104, or output of an impending trip notification from edge device 106. Since trip timeline tile 362 and trip information tile 364 can update display of information in an ad hoc fashion in response to the occurrence of the event, the display of data can be scaled in a displayed time line graph or table.

It is noted that the disclosure is not limited to the specific examples of conditions for refreshing any of pages 300, 320, 340, 360. It is further noted that the user can navigate between pages 300, 320, 340, 360 using page navigation user controls (not shown).

FIGS. 4A-4D, 5A, and 5B show exemplary and non-limiting flowcharts illustrating a method for responding to an external diagnostics request in accordance with certain illustrated embodiments. Before turning to the description of FIGS. 4A-4D, 5A, and 5B, it is noted that the flowcharts in FIGS. 4A-4D, 5A, and 5B show examples in which operational blocks are carried out in a particular order, as indicated by lines showing the flow between the operational blocks, but the various blocks shown in these flowcharts can be performed in a different order, or in a different combination or sub-combination. It should be appreciated that in some embodiments some of the blocks described below may be combined into a single block. In some embodiments, one or more additional blocks may be included. In some embodiments, one or more of the blocks can be omitted.

Figure 4A:
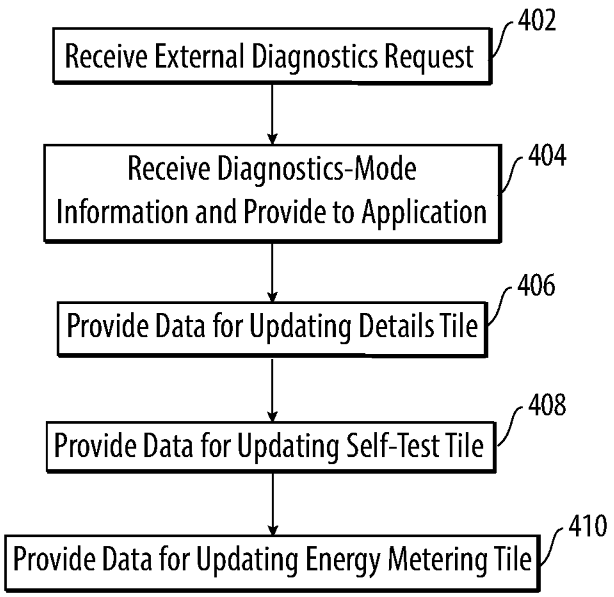
FIGS. 4A-4D are flowcharts of example operations of the circuit monitoring system for rendering pages of the field servicing application, in accordance with embodiments of the disclosure.

Flowcharts FIGS. 4A-4D show example flowcharts of a method performed by edge device 106 when receiving and processing an external diagnostics requests from user device 120 or server 122. Prior to beginning the method shown in FIG. 4A a user has navigated to a settings page of a GUI rendered by field servicing application executing on user device 120 or server 122, e.g., in conjunction with an associated browser. From the settings page the user has selected a maintenance page that allows selection of circuit breaker 104 or load center 102. With reference to FIG. 4A, and continued reference to FIGS. 1 and 3, at block 402, in response to the user selecting a circuit breaker 104 via the maintenance page, an external diagnostics request is submitted to and received by edge device 106. At block 404, diagnostics-mode information including diagnostics reports are requested and received from the breaker device 104 and provided to the field servicing application for identifying the selected breaker device and providing a name for the circuit to be displayed with the main diagnostics page 300. At block 406, data is provided for updating details tile 304. At block 408, data is provided for updating self-test tile 308. At block 410, data is provided for updating energy metering tile.

Figure 4B:
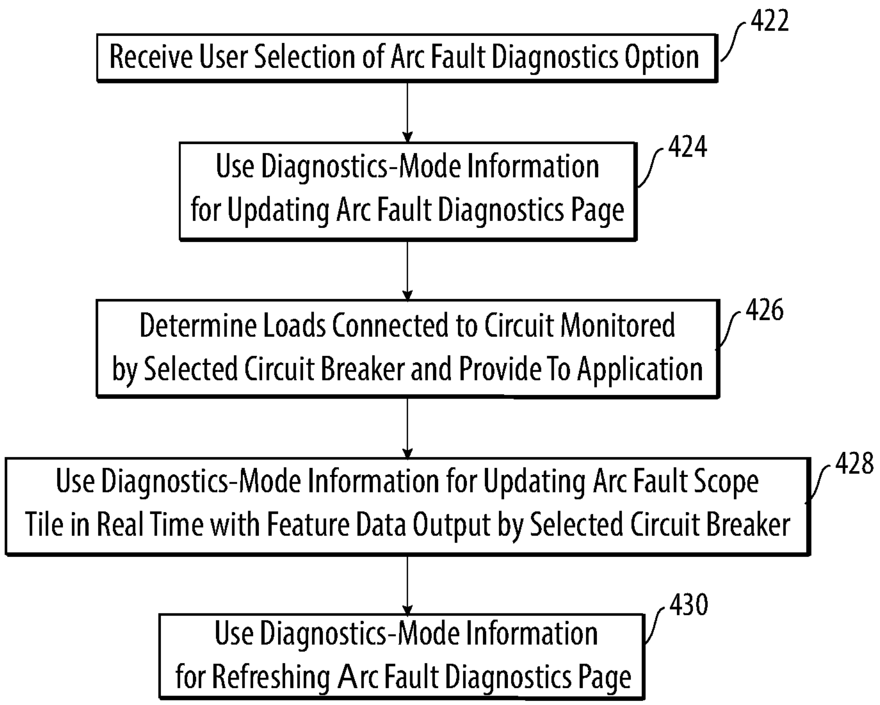

With reference to FIG. 4B, a user update of the external diagnostics request is received when the user selects the arc fault diagnostics option 312A by activating the associated IGE. Section 310A of real time meter tile 310 shows real time measurements of line voltage, line current and earth leakage measurements. At block 422, the user selection of the arc fault diagnostics option 312A is received. At block 424, diagnostics-mode information is used for updating arc fault diagnostics page 320. In particular, data is used to update meter tile 322 with real time line voltage and line current measurements. At block 426, the loads connected to the circuit monitored by the selected circuit breaker 104 are determined and provided to field servicing application for display in device list tile 324. In one or more embodiments, disaggregation is performed to determine which of the loads are operating at the time, and only the loads that are in operation are displayed in device list tile 324. Diagnostics-mode information is used for updating hazard fault indicator 325 to indicate whether or not a hazardous fault has been detected. At block 428, diagnostics-mode information is used for updating the arc fault scope tile 326 in real time with feature data output by the selected circuit breaker 104. At block 430, diagnostics-mode information is used for refreshing arc fault diagnostics page 320, which can be performed periodically, e.g., each second, or by push (e.g., by refreshing the data periodically, automatically) or pull demands. For example, arc fault meter tile 326 can be refreshed when a new selection is selected by the user from the menu of available arc fault feature data by user activation of an arc fault data selector IGE 327.

Figure 4C:
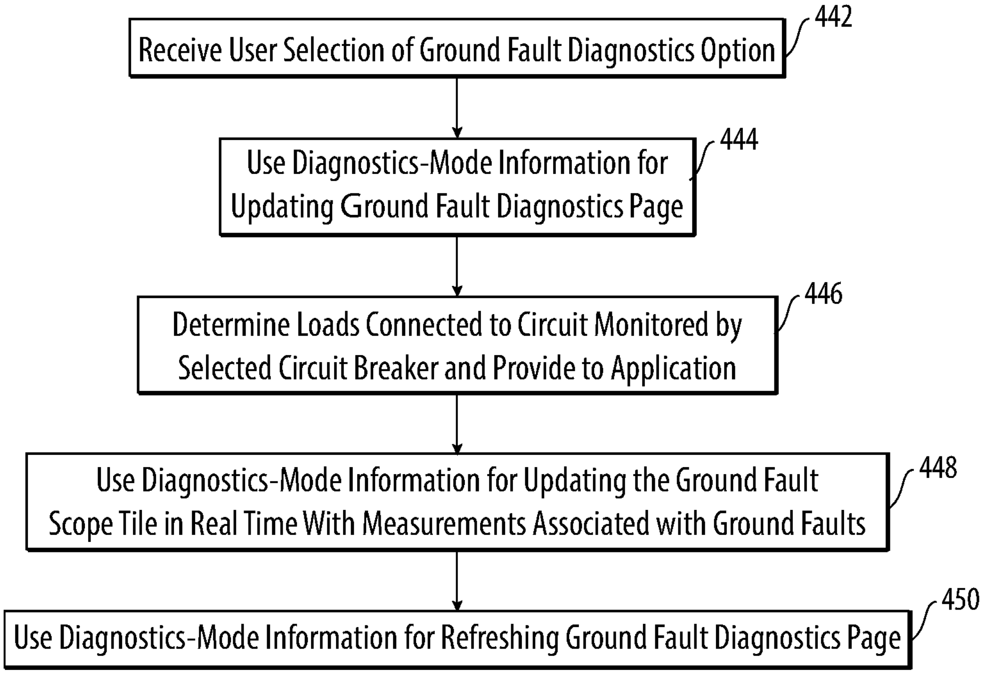

With reference to FIG. 4C, a user update of the external diagnostics request is received when the user selects the ground fault diagnostics option 312B by activating the associated IGE. At block 442, the user selection of the ground fault diagnostics option 312B is received. At block 444, diagnostics-mode information is used for updating ground fault diagnostics page 340. In particular, data is used for updating meter tile 342 with real time line voltage and line current measurements. At block 446, the loads connected to the circuit monitored by the selected circuit breaker 104 are determined and provided to field servicing application for display in device list tile 344. In one or more embodiments, disaggregation is performed to determine which of the loads are operating at the time, and only the loads that are in operation are displayed in device list tile 344. Diagnostics-mode information is used for updating hazard fault indicator 345 to indicate whether or not a hazardous fault has been detected. At block 448, diagnostics-mode information is used for updating the ground fault scope tile 346 in real time with measurements associated with ground faults.

At block 450, diagnostics-mode information is used for refreshing ground fault diagnostics page 340, which can be performed periodically, e.g., each second, or by push or pull demands. For example, ground fault scope tile 346 can be refreshed when a new selection is selected by the user from the menu of available ground fault feature data by user activation of ground fault data selector IGE 347.

Figure 4D:
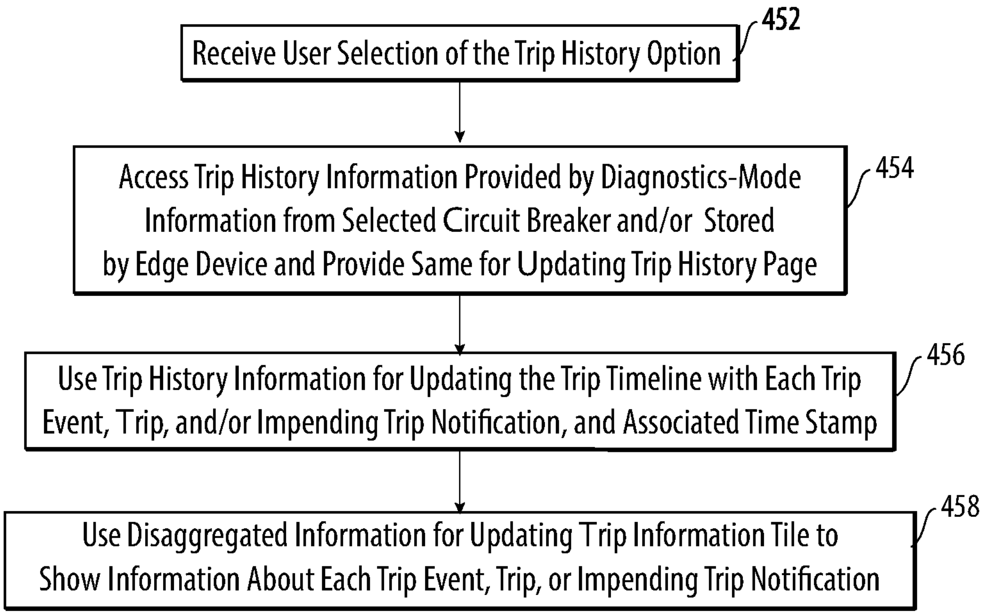

With reference to FIG. 4D, a user update of the external diagnostics request is received when the user selects the trip history option 312C by activating the associated IGE. At block 452, the user selection of the trip history option 312C is received. At block 454, trip history information provided by diagnostics-mode information from the selected circuit breaker 104 and/or stored by edge device 106 is accessed and provided for updating trip history page 360. At block 456, the trip history information is used for updating the trip timeline 362 with each trip event, trip, and/or impending trip notification, and an associated time stamp. The trip history information can be null or include one or more warning event notifications and trip notifications output by the selected circuit breaker 104 and/or one or more impending trip notifications determined by the analysis device 124 (which can be any of the edge device 106, the user device 120 and/or the server 122). At block 458 disaggregated information is used for updating the trip information tile to show information about each trip event, trip, or impending trip notification, such as the time of occurrence, which loads were operating at the time, and the nature of fault involved. The disaggregation is performed in the analysis device 124.

Figure 5A:
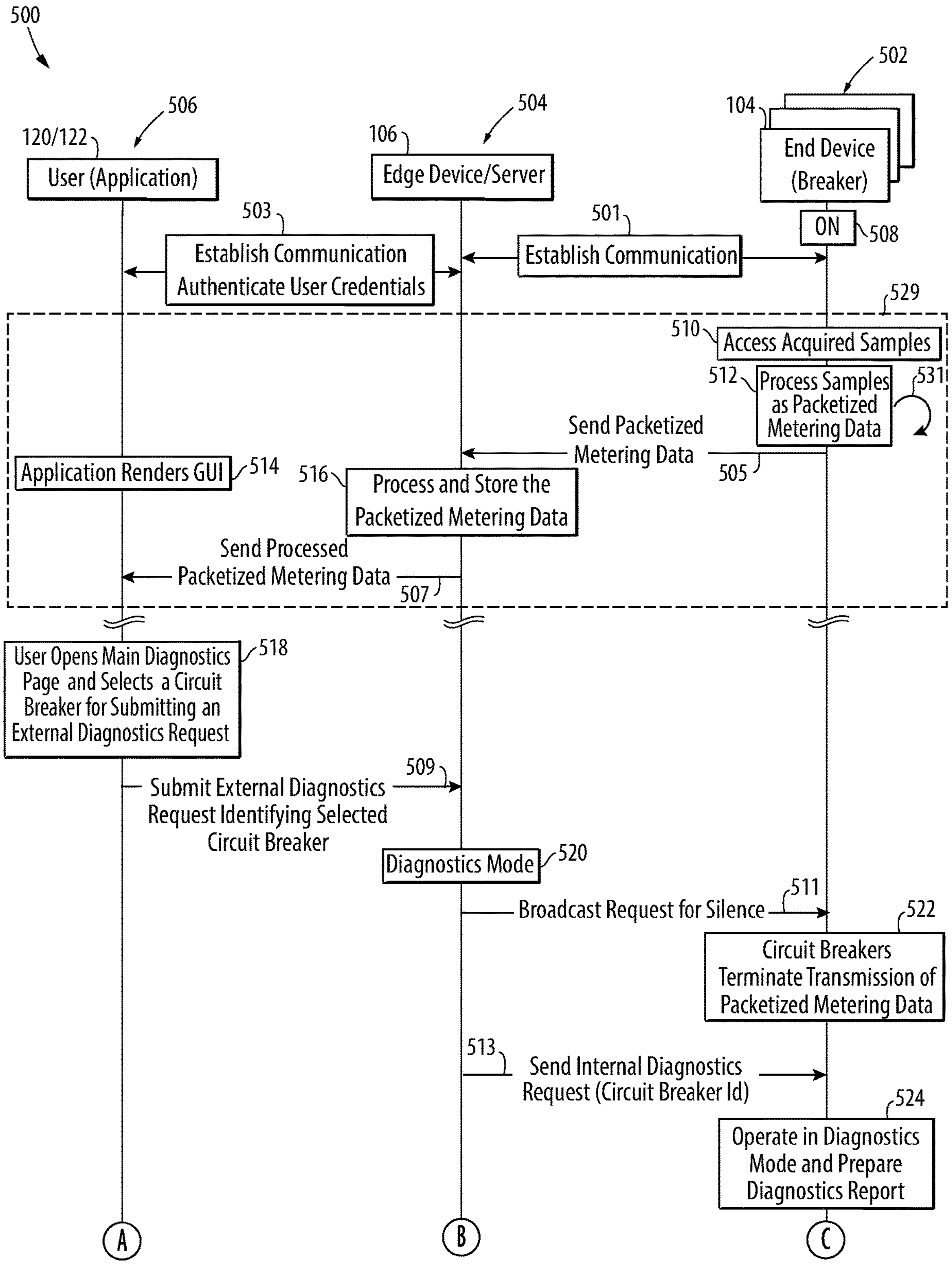
FIGS. 5A and 5B are a process flowchart of example operation of the circuit management system of FIG. 1, in accordance with embodiments of the disclosure.
Figure 5B:
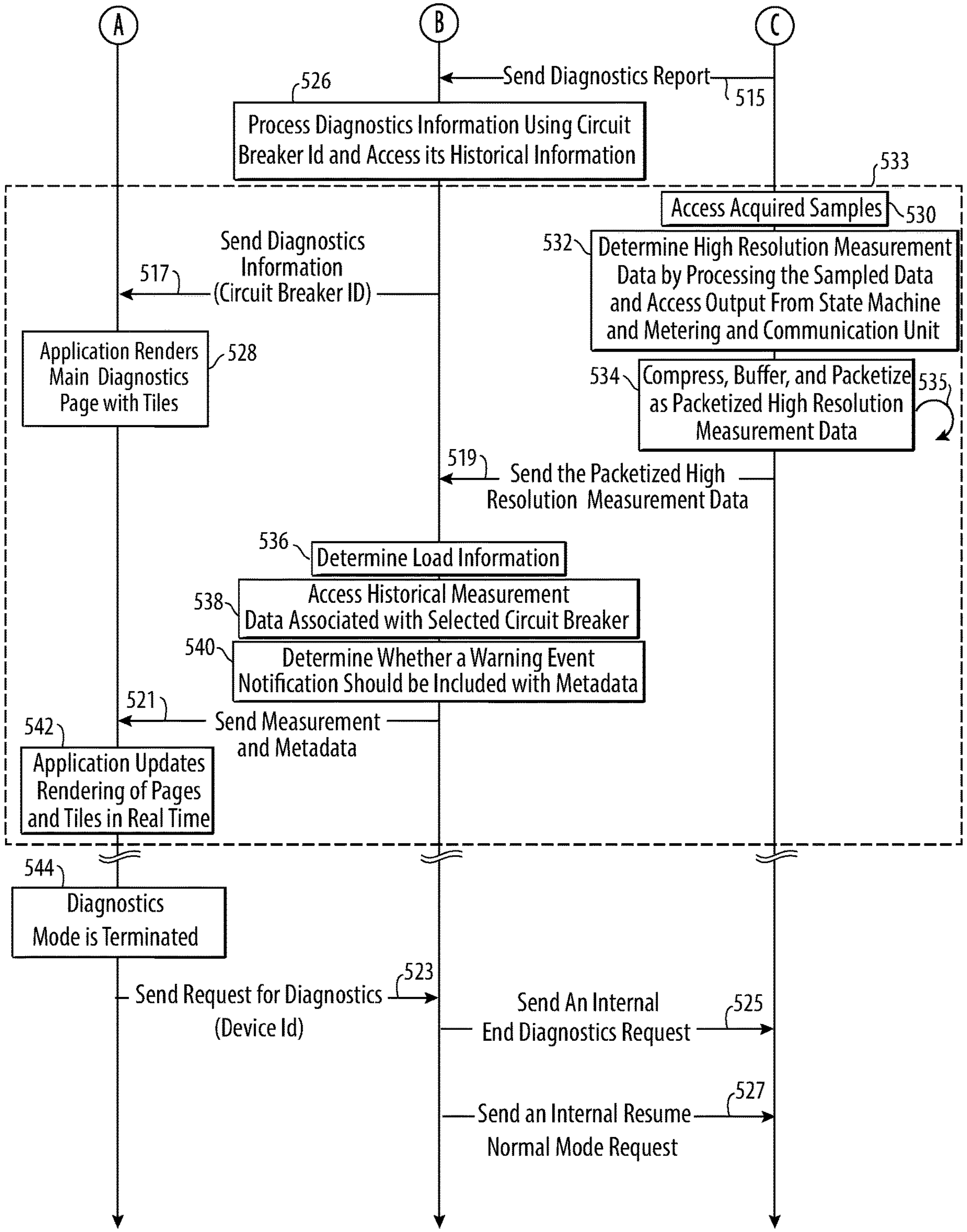

With reference to FIGS. 5A and 5B, and continued reference to FIG. 1, a process flowchart 500 is shown in accordance with one or more embodiments of an example flow between a circuit breaker 104 of a plurality of circuit breakers in load center 102, edge device 106, and device 120 or server 122. It is understood that any of the processing, storing, converting, and associating tasks shown and described could be performed by one of analysis devices 124 could be performed by another of the analysis devices 124, with appropriate authentication, authorization and communication.

Operations performed by circuit breakers 104 of a load center 102 are shown in column 502, operations performed by edge device 106 are shown in column 504, and operations performed by user device 120 or server 122 executing field servicing application are shown at column 506.

At block 508, the circuit breakers 104 operating as end devices are turned on. At flow 501 communication is established between the circuit breakers 104 and an edge device 106. Flow 501 can include one-way or two-way exchange of handshaking signals and authentication messages. At flow 503 communication is established between the edge device 106 and the user device 120 or server 122 via the field servicing application. Flow 503 can include one-way or two-way exchange of handshaking signals and authentication messages, such as to authenticate a user operating the user device 120 or server 122.

At block 510, the circuit breakers 104, operating in a normal mode, acquire and process samples (e.g., by arc fault sensor(s) and AFE 202A and ground fault sensor(s) and AFE 202B, signal acquisition unit 206, and feature processing unit 208 of FIG. 2). At block 512 the processed samples are output as packetized metering data (e.g., by metering and communication unit 214 of FIG. 2). The packetized metering data is also referred to as normal-mode data. At flow 505, the metering data is output to edge device 106 at intervals (by push or pull communication). At block 514, the field servicing application renders the GUI for interfacing with a user. At block 516, edge device 106, operating in normal mode, processes and stores the packetized metering data. At flow 507, the metering data and metadata based on the processing performed is sent to user device 120 or server 122. The metadata includes identification of the load (e.g., by descriptive name (such as. garbage disposal, blender, microwave, etc.), make, and model number. Identification of the load is determined using disaggregation techniques.

The field servicing application executing on user device 120 or server 122 has rendered a GUI that can display data received from edge device 106 and allows a user to enter an external diagnostics request. Accordingly, the packetized metering data can be displayed by the GUI.

Blocks 510, 512, 514, 516 and flows 505 and 507 included in dotted box 529 are performed and can be repeated indefinitely, as indicated by circular arrow 531, while the circuit management system 100 is operating in a normal mode, during which all of the circuit breakers 104 of load center 102 can operate in normal mode.

At block 518, a diagnostics mode is initiated when the user submits an external diagnostics request. In the example shown, the external diagnostics request is submitted by the user selecting the main diagnostics page and activating an IGE associated with a selected circuit breaker 104 for selecting the selected circuit breaker 104. At flow 509, the external diagnostics request identifying the selected circuit breaker 104 is submitted to edge device 106 (wherein "device ID" refers to the ID of the selected circuit breaker 104). Since more than one user device 120 or server 122 can submit external diagnostics requests, the external diagnostics request also can identify the device from which it was submitted.

The external diagnostics request can be updated, for example by selecting IGEs associated with any of fault/trip options 312, which results in edge device 106 obtaining fault information from the selected circuit breaker 104 and providing it to the field servicing application executing on user device 120 or server 122 for rendering updates to tiles of the appropriate fault page, e.g., arc fault diagnostics page 320, ground fault diagnostics page 340, or trip history page 360.

At block 520, edge device 106 transitions to diagnostics mode. At flow 511, edge device 106 sends a broadcast message to all of the circuit breakers 104 to operate in silent mode. At block 522, the circuit breakers 104 respond by terminating transmission of packetized metering data. At flow 513, edge device 106 transmits an internal diagnostics request specifically to or identifying the selected circuit breaker 104. At block 524, the selected circuit breaker 104 responds to the internal diagnostics request by operating in diagnostics mode and preparing a diagnostics report. The diagnostics report can include, for example, versions of software (SW) and/or hardware (HW) used by the selected circuit breaker 104, results of tests performed by system diagnostics unit 220 on software and/or hardware of the selected circuit breaker 104, and a trip history information (including, for example, occurrence trips and/or output of warning event notifications and/or impending trip notifications, with contextual information). The diagnostics report is included in diagnostics-mode data output by circuit breaker 104 when operating in diagnostics mode. The diagnostics report is output at flow 515 from circuit breaker 104 to edge device 106.

Information sent by circuit breaker 104, e.g., at blocks 510, 512, 522, 524, 530, 532, and 534 includes an ID of the circuit breaker 104 that output the information. Information sent by edge device 106 includes an ID of the edge device 106 that output the information.

At block 526, edge device 106 determines and/or updates diagnostics information using the ID of the circuit breaker and accessing historical information associated with the identified circuit breaker 104, such as by looking up the historical information in a local (e.g., accessible by edge device 106) or a remote database (e.g., accessible by with server 122). The historical information can include, for example, usage information regarding operation of loads 110 connected to the branch 108 monitored by the circuit breaker 104 and diagnostics information provided by diagnostics reports from the circuit breaker 104, which includes trip history information.

At flow 517, the diagnostics information is transmitted from edge device 106 to the user device 120 or server 122. At block 528, the application executing on user device 120 or server 122 updates rendering of the main diagnostics page, including updating and displaying each of a label for a circuit connected to and being monitored by the selected circuit breaker 104, details tile 304, energy monitor tile 306, self-test tile 308, and fault/trip options tile 310.

At block 530, the selected circuit breaker 104 acquires samples. The samples can be acquired from signal acquisition unit 206 and/or feature processing unit 208 at a higher resolution than samples acquired for generating metering data when operating in normal mode, such as by increasing the sample rate. These high-resolution samples can be acquired at a half-cycle resolution, and in one or more embodiments can include waveform samples.

At block 532, the selected circuit breaker 104 determines high resolution measurement data by processing the sampled data and output from its state machine 210 and metering and communication unit 214. When operating in diagnostics mode, processing rates can be increased relative to when operating in the normal mode, such as for processing by signal acquisition unit 206, feature processing unit 208, state machine 210, warning notification unit 216, and/or metering and communication unit 214. At block 534, the output from block 532 is compressed, buffered, and packetized as packetized high resolution measurement data, such as one packet per a predetermined number of half-cycles (HC), such as 30-60 HC, which can be compressed efficiently. Compression of AC current and voltage is described in U.S. application Ser. No. 10/848,198, which is incorporated herein by reference in its entirety. The packetized high resolution measurement data provided at block 534 is included in diagnostics-mode data output by circuit breaker 104 when operating in diagnostics mode. At flow 519, the packetized high resolution measurement data is output to edge device 106, such as at a frequency that is efficient for transmitting the high resolution measurement data, as described in U.S. application Ser. No. 10/848,198. The frequency used for transmission of the high resolution measurement data can be higher than the frequency used for transmission of the metering data.

At block 536, edge device 106 performs disaggregation processes to determine load information, such as which loads are connected to the selected circuit breaker 104 and when the loads are operating and/or are associated to detected faults. At block 538, historical measurement data associated with the selected circuit breaker 104 is accessed. At block 540, the newly received measurement data is compared with the historical measurement data to determine whether a warning event notification should be included with the metadata. In the event that a warning event notification is warranted, particular measurement data associated with the warning event can be included with the metadata. At flow 521, measurement data and metadata are provided to the user device 120 or server 122. At block 542, the field servicing application executing on user device 120 or server 122 updates rendering of the main diagnostics page or the appropriate faults page and updating the tiles of each page in real time, e.g., at intervals.

At block 544 the diagnostics mode is terminated. This can be caused, as shown in the example of FIG. 5B, by the user closing the maintenance page. In other non-limiting the diagnostics mode can be terminated based on a condition, such as a timeout condition or upon the submitting an external diagnostics request for a different circuit breaker 104, such as while troubleshooting different branches 108.

Blocks 528, 530, 532, 534, 536, 538, 540 and flows 517, 519, and 521 included in dotted box 533 are performed and can be repeated until diagnostics mode is terminated, as indicated by circular arrow 535. In the example shown (without limitation to this particular example), only the selected circuit breaker 104 participates during operation in diagnostics mode.

At flow 523, an external end diagnostics request is transmitted from user device 120 or server 122 to edge device 106. At flow 525, an internal end diagnostics request is transmitted from edge device 106 to the selected circuit breaker or identifying the selected circuit breaker 104 instructing the selected circuit breaker to terminate operating in diagnostics mode. At flow 527, an internal resume normal mode request is transmitted from edge device 106 to the plurality of circuit breakers 104 of load center 102 to resume operation in normal mode.

Figure 6:
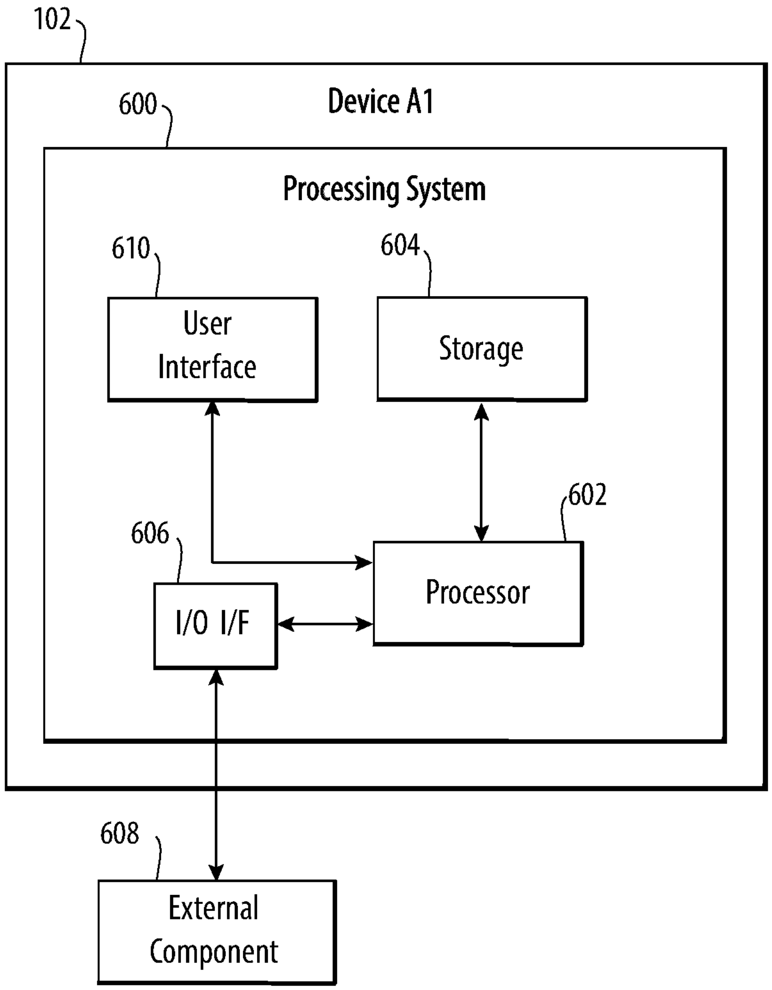
FIG. 6 is a block diagram of an exemplary computer system that implements any of the smart devices shown in FIG. 1, in accordance with embodiments of the disclosure.

With reference to FIG. 6, a block diagram of an example computing system 600 is shown, which provides an example configuration of a device A1 implemented using an example processing system. Device A1 can be any smart element included in circuit management system 100, such as circuit breaker 104, edge device 106, user device 120, and/or server 122. Additionally, portions of device A1 could be configured as software, and computing system 600 could represent such portions. Computing system 600 is only one example of a suitable system and is not intended to suggest any limitation as to the scope of use or functionality of embodiments of the disclosure described herein. Computing system 600 can be implemented using hardware, software, and/or firmware. Regardless, computing system 600 is capable of being implemented and/or performing functionality as set forth in the disclosure.

Computing system 600 is shown in the form of a general-purpose computing device. Computing system 600 includes a processing device 602, memory 604, an input/output (I/O) interface (I/F) 606 that can communicate with an internal component, such as a user interface 610, and optionally an external component 608.

The processing device 602 can include, for example, a programmable logic device (PLD), microprocessor, DSP, a microcontroller, an FPGA, an ASIC, and/or other discrete or integrated logic circuitry having similar processing capabilities.

The processing device 602 and the memory 604 can be included in components provided in the FPGA, ASIC, microcontroller, or microprocessor, for example. Memory 604 can include, for example, volatile and non-volatile memory for storing data temporarily or long term, and for storing programmable instructions executable by the processing device 602. Memory 604 can be a removable (e.g., portable) memory for storage of program instructions. I/O I/F 606 can include an interface and/or conductors to couple to the one or more internal components 610 and/or external components 608.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flow diagram and/or block diagram block or blocks.

The computer program instructions may also be loaded onto a computer, other programmable data processing apparatus, or other devices to cause a series of operational operations to be performed on the computer, other programmable apparatus or other devices to produce a computer implemented process such that the instructions which execute on the computer or other programmable apparatus provide processes for implementing the functions/acts specified in the block diagram block or blocks.

Embodiments of device A1 may be implemented or executed by one or more computer systems, such as a microprocessor. Each computer system 600 can be included within device A1, or multiple instances thereof. In the example shown, computer system is embedded in device A1. In various embodiments, computer system 600 may include one or more of a microprocessor, an FPGA, application specific integrated circuit (ASIC), microcontroller. The computer system 600 can be provided as an embedded device. Portions of the computer system 600 can be provided externally, such by way of a centralized computer.

Computer system 600 is only one example of a suitable system and is not intended to suggest any limitation as to the scope of use or functionality of embodiments of the disclosure described herein. Regardless, computer system 600 is capable of being implemented and/or performing any of the functionality set forth hereinabove.

Computer system 600 may be described in the general context of computer system-executable instructions, such as program modules, being executed by a computer system. Generally, program modules may include routines, programs, objects, components, logic, data structures, and so on that perform particular tasks or implement particular abstract data types.

In the preceding, reference is made to various embodiments. However, the scope of the present disclosure is not limited to the specific described embodiments. Instead, any combination of the described features and elements, whether related to different embodiments or not, is contemplated to implement and practice contemplated embodiments. Furthermore, although embodiments may achieve advantages over other possible solutions or over the prior art, whether or not a particular advantage is achieved by a given embodiment is not limiting of the scope of the present disclosure. Thus, the preceding aspects, features, embodiments and advantages are merely illustrative and are not considered elements or limitations of the appended claims except where explicitly recited in a claim(s).

The various embodiments disclosed herein may be implemented as a system, method or computer program product. Accordingly, aspects may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects may take the form of a computer program product embodied in one or more computer-readable medium(s) having computer-readable program code embodied thereon.

Any combination of one or more computer-readable medium(s) may be utilized. The computer-readable medium may be a non-transitory computer-readable medium. A non-transitory computer-readable medium may be, for example, but not limited to, an electronic, magnetic, optical, electromagnetic, infrared, or semiconductor system, apparatus, or device, or any suitable combination of the foregoing. More specific examples (a non-exhaustive list) of the non-transitory computer-readable medium can include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. Program code embodied on a computer-readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages. Moreover, such computer program code can execute using a single computer system or by multiple computer systems communicating with one another (e.g., using a local area network (LAN), wide area network (WAN), the Internet, etc.). While various features in the preceding are described with reference to flowchart illustrations and/or block diagrams, a person of ordinary skill in the art will understand that each block of the flowchart illustrations and/or block diagrams, as well as combinations of blocks in the flowchart illustrations and/or block diagrams, can be implemented by computer logic (e.g., computer program instructions, hardware logic, a combination of the two, etc.). Generally, computer program instructions may be provided to a processor(s) of a general-purpose computer, special-purpose computer, or other programmable data processing apparatus. Moreover, the execution of such computer program instructions using the processor(s) produces a machine that can carry out a function(s) or act(s) specified in the flowchart and/or block diagram block or blocks.

The flowchart and block diagrams in the Figures illustrate the architecture, functionality and/or operation of possible implementations of various embodiments of the present disclosure. In this regard, each block in the flowchart or block diagrams may represent a module, segment or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It is to be understood that the above description is intended to be illustrative, and not restrictive. Many other implementation examples are apparent upon reading and understanding the above description. Although the disclosure describes specific examples, it is recognized that the systems and methods of the disclosure are not limited to the examples described herein, but may be practiced with modifications within the scope of the appended claims. Accordingly, the specification and drawings are to be regarded in an illustrative sense rather than a restrictive sense. The scope of the disclosure should, therefore, be determined with reference to the appended claims, along with the full scope of equivalents to which such claims are entitled.

I claim:

1. A method of monitoring, by one or more circuit breakers, a circuit having one or more loads, the method comprising:

operating a first circuit breaker of the one or more circuit breakers in a normal mode comprising:

acquiring, at a first resolution, first signals associated with electrical properties of the circuit with a load, the first signals corresponding to a first type of data, the first type of data including at least one of current measurements, arc fault data, or ground fault data;

outputting normal-mode data including first features of the first signals; and receiving a start-diagnostics request;

in response to receiving the start-diagnostics request, changing operation of the first circuit breaker from the normal mode to a diagnostics mode by at least changing the first resolution to a second resolution different from the first resolution, the changing of the operation from the normal mode to the diagnostics mode for use in troubleshooting the circuit; and operating the first circuit breaker in the diagnostics mode comprising:

acquiring, at the second resolution, second signals associated with the electrical properties of the circuit with the load; and outputting diagnostics-mode data including second features of the second signals.

2. The method of claim 1, further comprising:

receiving, by the first circuit breaker, an end-diagnostics request; and terminating operation of the first circuit breaker in the diagnostics mode in response to receipt of the end-diagnostics request.

3. The method of claim 1, wherein the normal-mode data includes results of analyzing the first signals for an electrical fault and the diagnostics-mode data includes results of analyzing the second signals for an electrical fault.

4. The method of claim 1, wherein operating the first circuit breaker in the diagnostics mode further comprises processing the second signals.

5. The method of claim 2, wherein the one or more circuit breakers includes at least two circuit breakers, the method further comprising:

the at least two circuit breakers receiving a silence request via one or more broadcast or unicast messages in association with the first circuit breaker receiving the start-diagnostics request;

ceasing outputting second normal-mode data by the at least two circuit breakers in response to receiving the silence request;

the at least two circuit breakers receiving an end-silence request via one or more broadcast or unicast messages in association with the first circuit breaker receiving the end-diagnostics request; and resuming outputting the second normal-mode data by the at least two circuit breakers in response to receiving the end-silence request.

6. The method of claim 1, wherein outputting, by the first circuit breaker, the normal-mode data includes outputting the normal-mode data to at least one external device, and outputting by the first circuit breaker the diagnostics-mode data includes outputting features of the second signals acquired by the first circuit breaker about electrical properties of the circuit with the load to the at least one external device, the at least one external device including at least one of an edge device, a remote user device, or a remote server.

7. The method of claim 1, wherein the first resolution is lower than the second resolution.

8. The method of claim 1, wherein the second signals correspond to a second type of data, the second type of data including at least one of waveforms for voltage, waveforms for current, raw data, line current, RF presence samples, voltage samples, line current samples, or RF receiver strength signal indicator (RSSI), and wherein one or more of which are acquired at the second resolution.

9. A circuit management system for monitoring, by one or more circuit breakers, a circuit having one or more loads, the circuit management system comprising:

a first circuit breaker of the one or more circuit breakers configured to:

operate in a normal mode and to change to operating in a diagnostics mode by at least changing a first resolution of signal acquisition to a second resolution of signal acquisition in response to receiving a start-diagnostics request and terminating operation in the diagnostics mode and returning to operating in the normal mode by at least changing the second resolution to the first resolution in response to receiving an end-diagnostics request, wherein operating in the normal mode comprises outputting, by the first circuit breaker, normal-mode data including first features of first signals acquired by the first circuit breaker about electrical properties of the circuit with a load, wherein the first signals are acquired by the first circuit breaker at the first resolution, and wherein operating in the diagnostics mode comprises outputting, by the first circuit breaker, diagnostics-mode data including second features of second signals acquired by the first circuit breaker about electrical properties of the circuit with the load, wherein the second signals are acquired by the first circuit breaker at the second resolution that is different than the first resolution.

10. The circuit management system of claim 9, wherein the normal-mode data includes results of analyzing the first signals for an electrical fault and the diagnostics-mode data includes results of analyzing the second signals for an electrical fault, and at least two circuit breakers of the one or more circuit breakers are configured to:

receive a silence request via one or more broadcast or unicast messages in association with the first circuit breaker receiving the start-diagnostics request;

cease outputting second normal-mode data in response receiving the silence request, receive an end-silence request via one or more broadcast or unicast messages in association with the first circuit breaker receiving the end-diagnostics request; and resume outputting the second normal-mode data by the at least two circuit breakers in response to receiving the end-silence request.

11. The circuit management system of claim 9, wherein the first resolution is lower than the second resolution.

12. A circuit management system for monitoring a circuit having one or more loads, the circuit management system comprising:

an edge device configured to:

send a start-diagnostics request to a first circuit breaker of one or more circuit breakers for causing the first circuit breaker to change from operating in a normal mode to operating in a diagnostics mode by at least changing a first resolution of signal acquisition to a second resolution of signal resolution; and send an end-diagnostics request to the first circuit breaker for causing the first circuit breaker to terminate operating in the diagnostics mode and return to operating in the normal mode by at least changing the second resolution to the first resolution, wherein when the first circuit breaker operates in the normal mode, the edge device is configured to receive normal-mode data from the first circuit breaker, the normal-mode data having the first resolution and including first features of first signals acquired by the first circuit breaker about electrical properties of the circuit, and wherein when the first circuit breaker operates in the diagnostics mode, the edge device is configured to receive diagnostics-mode data from the first circuit breaker, the diagnostics-mode data having the second resolution that is different than the first resolution and including second features of second signals acquired by the first circuit breaker about electrical properties of the circuit.

13. The circuit management system of claim 12, wherein the normal-mode data includes results of analyzing the first signals for an electrical fault and the diagnostics-mode data includes results of analyzing the second signals for an electrical fault, and the edge device is further configured to send a silence request via one or more broadcast or unicast messages to at least two circuit breakers of the one or more circuit breakers in association with the first circuit breaker receiving the start-diagnostics request, to cause the at least two circuit breakers to cease outputting the normal-mode data, and to send to the at least two circuit breakers an end-silence request via one or more broadcast or unicast messages in association with the first circuit breaker receiving the end-diagnostics request to cause the at least two circuit breakers to resume outputting the normal-mode data.

14. The circuit management system of claim 13, wherein the edge device is further configured to:

receive an external start-diagnostics request or an external terminate-diagnostics request from a device external to the edge device identifying the first circuit breaker from among the one or more circuit breakers;

transmit the start-diagnostics request to the first circuit breaker and the silence request to the at least two circuit breakers in response to receiving the external start-diagnostics request; and transmit the end-diagnostics request to the first circuit breaker and the end-silence request to the at least two circuit breakers in response to receiving the external terminate-diagnostics request in response to receiving the external terminate-diagnostics request.

15. The circuit management system of claim 12, wherein the first resolution is lower than the second resolution.

16. A circuit breaker comprising:

at least one memory configured to store processor-executable instructions; and at least one hardware processor configured to execute the processor-executable instructions to:

operate in a normal mode by:

acquiring first signals at a first resolution; and outputting normal-mode data including first features of the first signals associated with electrical properties of a first circuit;

in response to receiving a start-diagnostics request, change from operating in the normal mode to operating in a diagnostics mode by at least changing the first resolution to a second resolution, the first resolution different from the second resolution;

operate in the diagnostics mode by:

acquiring second signals at the second resolution; and outputting diagnostics-mode data including second features of the second signals associated with the electrical properties of the first circuit; and in response to receiving an end-diagnostics request, terminate operation in the diagnostics mode and return to operating in the normal mode by at least changing the second resolution to the first resolution.

17. The circuit breaker of claim 16, wherein the first resolution is lower than the second resolution.

18. The circuit breaker of claim 16, wherein the first signals correspond to a first type of data, the first type of data including at least one of current measurements, arc fault data, or ground fault data, and the at least one hardware processor is configured to:

analyze the first signals to detect an electrical fault, and the normal-mode data comprises an indication of whether the electrical fault is detected; and analyze the second signals to detect an electrical fault, and the diagnostics-mode data comprises an indication of whether the electrical fault is detected.

19. The circuit breaker of claim 16, wherein the at least one hardware processor is configured to:

receive a silence request via one or more broadcast or unicast messages in association with a different circuit breaker receiving the start-diagnostics request;

cease outputting the normal-mode data in response to receiving the silence request; and in response to receiving an end-silence request via one or more broadcast or unicast messages in association with the different circuit breaker receiving the end-diagnostics request, resume outputting the normal-mode data.

20. A load center comprising:

a plurality of circuits respectively comprising an interface to one or more loads; and a plurality of circuit breakers, each of the plurality of circuit breakers coupled to a respective one of the plurality of circuits, the plurality of circuit breakers comprising a first circuit breaker coupled to a first circuit of the plurality of circuits, and the first circuit breaker is configured to:

operate in a normal mode by:

acquiring first signals at a first resolution; and outputting first normal-mode data including first features of the first signals associated with electrical properties of the first circuit;

in response to receiving a start-diagnostics request, change from operating in the normal mode to operating in a diagnostics mode by at least changing the first resolution to a second resolution, the first resolution different from the second resolution;

operate in the diagnostics mode by:

acquiring second signals at the second resolution; and outputting diagnostics-mode data including second features of the second signals associated with the electrical properties of the first circuit; and in response to receiving an end-diagnostics request, terminate operation in the diagnostics mode and return to operating in the normal mode by at least changing the second resolution to the first resolution.

21. The load center of claim 20, wherein the first resolution is lower than the second resolution.

22. The load center of claim 20, wherein the first circuit breaker is configured to:

analyze the first signals to detect an electrical fault, and the first normal-mode data comprises an indication of whether the electrical fault is detected; and analyze the second signals to detect an electrical fault, and the diagnostics-mode data comprises an indication of whether the electrical fault is detected.

23. The load center of claim 20, wherein the plurality of circuit breakers includes a second circuit breaker, and the second circuit breaker is configured to:

receive a silence request via one or more broadcast or unicast messages in association with the first circuit breaker receiving the start-diagnostics request;

cease outputting second normal-mode data in response to receiving the silence request; and in response to receiving an end-silence request via one or more broadcast or unicast messages in association with the first circuit breaker receiving the end-diagnostics request, resume outputting the second normal-mode data.

* * * * *